United States Patent
Izuta et al.

(10) Patent No.: US 8,361,234 B2
(45) Date of Patent: Jan. 29, 2013

(54) SUBSTRATE TREATMENT APPARATUS

(75) Inventors: Takashi Izuta, Kyoto (JP); Hiroaki Ishii, Kyoto (JP); Asuka Yoshizumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 171 days.

(21) Appl. No.: 12/608,662

(22) Filed: Oct. 29, 2009

(65) Prior Publication Data

US 2010/0101497 A1   Apr. 29, 2010

(30) Foreign Application Priority Data

Oct. 29, 2008 (JP) ................................. 2008-278568
Mar. 30, 2009 (JP) ................................. 2009-82614

(51) Int. Cl.
*C23C 16/44*   (2006.01)
(52) U.S. Cl. .................... 118/730; 118/715; 156/345.55; 156/345.33
(58) Field of Classification Search ............. 156/345.33, 156/345.55, 345.29, 345.26, 345.21; 118/730, 118/715
See application file for complete search history.

(56) References Cited

U.S. PATENT DOCUMENTS

| | | | |
|---|---|---|---|
| 6,193,798 B1 | 2/2001 | Sumnitsch | |
| 6,273,104 B1 | 8/2001 | Shinbara et al. | |
| 6,669,808 B2 | 12/2003 | Adachi et al. | |
| 6,793,769 B2* | 9/2004 | Kajino et al. | 156/345.55 |
| 7,722,736 B2* | 5/2010 | Miya | 156/345.17 |
| 2006/0021636 A1* | 2/2006 | Miya | 134/33 |
| 2010/0101497 A1* | 4/2010 | Izuta et al. | 118/730 |
| 2012/0174429 A1 | 7/2012 | Izuta et al. | |

FOREIGN PATENT DOCUMENTS

| | | |
|---|---|---|
| JP | 63-73626 | 4/1988 |
| JP | 2004-158482 | 6/2004 |
| JP | 2006-351805 | 12/2006 |

* cited by examiner

*Primary Examiner* — Sylvia R. MacArthur
(74) *Attorney, Agent, or Firm* — Ostrolenk Faber LLP

(57) ABSTRACT

A substrate treatment apparatus includes a substrate holding unit, a gas ejection nozzle, and a gas supply unit. The substrate holding unit is configured to hold a substrate. The gas supply unit is configured to supply a gas to the gas ejection nozzle. The gas ejection nozzle is disposed to be positioned adjacent a center portion of the substrate held by the substrate holding unit. The gas ejection nozzle has a gas ejection port. The gas ejection nozzle is configured to eject the gas radially from the gas ejection port over the substrate held by the substrate holding unit to form a gas-flow for covering the substrate.

16 Claims, 12 Drawing Sheets

SUBSTRATE TREATMENT APPARATUS

BACKGROUND OF THE INVENTION

1. Field of the Invention

The present invention relates to a substrate treatment apparatus which treats a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In a production process for a semiconductor device, a liquid crystal display device or the like, a substrate treatment apparatus is used for treating a substrate such as a semiconductor wafer or a glass substrate for the liquid crystal display device. A substrate treatment apparatus of a single substrate treatment type adapted to treat a single substrate at a time includes, for example, a spin chuck which horizontally holds and rotates a substrate, and a treatment liquid nozzle which supplies a treatment liquid onto an upper surface of the substrate held by the spin chuck. The spin chuck and the treatment liquid nozzle are provided in a treatment chamber defined by a partition wall.

For the treatment of the substrate, the substrate treatment apparatus, for example, continuously spouts the treatment liquid from the treatment liquid nozzle toward a center portion of the upper surface of the substrate while causing the spin chuck to rotate the substrate. The treatment liquid spouted from the treatment liquid nozzle is applied onto the center portion of the upper surface of the substrate, and receives a centrifugal force generated by the rotation of the substrate to instantaneously spread toward a peripheral portion of the upper surface of the substrate. Thus, the treatment liquid is supplied over the entire upper surface of the substrate, whereby the upper surface of the substrate is treated with the treatment liquid. After the treatment with the treatment liquid, the substrate is rotated at a higher speed by the spin chuck. Thus, a drying operation (spin-drying operation) is performed to dry the substrate by spinning off the treatment liquid from the substrate by a centrifugal force (see, for example, JP-A-2006-351805).

During the treatment with the treatment liquid or during the drying process, however, foreign matter such as particles is liable to fall onto the upper surface of the substrate. Therefore, the foreign matter is likely to adhere to the upper surface of the substrate to contaminate the substrate. Further, the mist of the treatment liquid drifting in the treatment chamber is likely to adhere to the upper surface of the substrate to contaminate the substrate.

SUMMARY OF THE INVENTION

It is an object of the present invention to provide a substrate treatment apparatus which suppresses or prevents contamination of a substrate.

A substrate treatment apparatus according to the present invention includes a substrate holding unit, a gas ejection nozzle, and a gas supply unit. The substrate holding unit is configured to hold a substrate. The gas supply unit is configured to supply a gas to the gas ejection nozzle. The gas ejection nozzle is arranged to be positioned adjacent a center portion of the substrate held by the substrate holding unit. The gas ejection nozzle has a gas ejection port. The gas ejection nozzle is configured to eject the gas radially from the gas ejection port over the substrate held by the substrate holding unit to form a gas-flow for covering the substrate.

With this arrangement, the gas-flow is formed as spreading radially about the gas ejection nozzle by ejecting the gas radially from the gas ejection port of the gas ejection nozzle. Since the gas ejection nozzle is arranged to be positioned adjacent the center portion of the substrate, the gas-flow can be formed as spreading over the substrate to cover the substrate. Thus, the substrate is protected from the foreign matter such as particles and the mist of the treatment liquid falling toward the substrate. This substantially prevents the foreign matter and the mist of the treatment liquid from adhering to the substrate, thereby suppressing or preventing the contamination of the substrate with the foreign matter such particles and the mist of the treatment liquid. In addition, the gas ejection nozzle is merely required to be capable of ejecting the gas from the vicinity of the center portion of the substrate, so that the gas ejection nozzle may have a smaller size than the substrate held by the substrate holding unit. This suppresses or prevents the contamination of the substrate while suppressing the size increase of the substrate treatment apparatus.

The gas ejection nozzle may be configured to eject the gas from the gas ejection port toward a peripheral portion of the substrate held by the substrate holding unit.

In this case, a conical gas-flow can be formed as spreading from the gas ejection nozzle toward the peripheral portion of the substrate by ejecting the gas radially from the gas ejection port. Therefore, a space between the gas ejection nozzle and the substrate is enclosed by the conical gas-flow to be thereby isolated from an ambient space. Thus, the foreign matter such as particles and the mist of the treatment liquid are substantially prevented from intruding into the space between the gas ejection nozzle and the substrate. This more reliably suppresses or prevents the contamination of the substrate which may otherwise occur when the foreign matter and the mist of the treatment liquid adhere to the substrate.

The substrate treatment apparatus may further include a rotation unit which rotates the substrate held by the substrate holding unit. In this case, the substrate holding unit may include a plurality of holding members to be disposed in association with a peripheral surface of the substrate for holding the substrate. Further, the gas ejection nozzle may be configured to eject the gas from the gas ejection port toward a perimeter defined by the holding members so as to form a gas-flow for covering the holding members and the substrate held by the holding members.

In this case, the substrate can be held by the holding members disposed in association with the peripheral surface of the substrate. The substrate held by the holding members can be rotated together with the holding members by the rotation unit. By ejecting the gas radially from the gas ejection port, the conical gas-flow can be formed as spreading from the gas ejection nozzle toward the perimeter defined by the holding members. Thus, the substrate held by the substrate holding unit and the holding members can be located in the space enclosed by the gas-flow. Therefore, the space between the substrate and the gas ejection nozzle and a space around the holding members are isolated from the ambient space by the gas-flow, so that these spaces are kept clean. When the substrate and the holding members are rotated by the rotation unit, the gas-flow is likely to be made turbulent around the holding members to cause an atmosphere around the holding members to intrude into the space adjacent to the substrate. Even in this case, the substrate, which is possibly exposed to the intruding atmosphere, is substantially free from contamination, because the intruding atmosphere is clean.

The gas ejection port may have a slit shape, and may annularly open in an outer surface of the gas ejection nozzle.

In this case, the gas can be swiftly ejected (jetted) from the gas ejection port, because the gas ejection port has a slit shape. Thus, the gas-flow can be maintained to reach a position apart from the gas ejection nozzle. Therefore, the substrate can be reliably protected by the gas-flow even at a position apart from the gas ejection nozzle. Since the gas ejection port is annular, the gas-flow spreading radially about the gas ejection nozzle can be easily formed by ejecting the gas from the gas ejection port. Where the gas ejection nozzle is columnar, for example, the slit-shaped gas ejection port may open in a side surface of the gas ejection nozzle.

Another substrate treatment apparatus according to the present invention includes a substrate holding unit, a gas ejection nozzle, and a gas supply unit. The substrate holding unit is configured to hold the substrate. The gas supply unit is configured to supply the gas to the gas ejection nozzle. The gas ejection nozzle is arranged to be positioned adjacent a center portion of the substrate held by the substrate holding unit. The gas ejection nozzle has an annular first gas ejection port and an annular second gas ejection port. The second gas ejection port is disposed closer to the substrate holding unit than the first gas ejection port. The gas ejection nozzle is configured to eject the gas radially from the first and second gas ejection ports over one of opposite major surfaces of the substrate held by the substrate holding unit.

With this arrangement, the gas ejection nozzle includes the annular first gas ejection port, and the annular second gas ejection port disposed closer to the substrate holding unit than the first gas ejection port. Further, the gas ejection nozzle is disposed adjacent the center portion of the substrate held by the substrate holding unit. Therefore, a gas-flow can be formed as spreading radially from the second gas ejection port over the one major surface of the substrate by supplying the gas to the gas ejection nozzle from the gas supply unit and ejecting the gas from the second gas ejection port. Therefore, the substrate is protected from the foreign matter such as particles and the droplets and the mist of the treatment liquid falling to the one major surface of the substrate by ejecting the gas from the second gas ejection port. This suppresses or prevents the contamination of the substrate.

Similarly, a gas-flow can be formed as spreading radially from the first gas ejection port over the one major surface of the substrate by ejecting the gas from the first gas ejection port. Therefore, two layered gas-flows can be formed by ejecting the gas from the first and second gas ejection ports. Further, the one major surface of the substrate can be covered with the two gas-flows. Thus, the one major surface of the substrate can be more reliably protected by the two gas-flows. This further suppresses the adhesion of the foreign matter and the mist of the treatment liquid to the substrate, thereby improving the cleanliness of the substrate. In addition, the gas ejection nozzle is merely required to be capable of ejecting the gas from the vicinity of the center portion of the substrate, so that the gas ejection nozzle may have a smaller size than the substrate held by the substrate holding unit. This suppresses or prevents the contamination of the substrate while suppressing the size increase of the substrate treatment apparatus.

The gas ejection nozzle may further include an opposed surface, and a third gas ejection port. The opposed surface may be opposed to the one major surface of the substrate held by the substrate holding unit. Further, the opposed surface may be disposed closer to the substrate holding unit than the first and second gas ejection ports. The third gas ejection port may be provided in the opposed surface.

In this case, the gas can be supplied into a space between the one major surface of the substrate and the opposed surface by ejecting the gas from the third gas ejection port. The gas supplied into the space between the one major surface of the substrate and the opposed surface flows outward to be ejected radially from the space between the one major surface of the substrate and the opposed surface. Therefore, a gas-flow can be formed as spreading radially about the third gas ejection port by ejecting the gas from the third gas ejection port. Thus, the one major surface of the substrate is covered with the gas-flow. Further, three layered gas-flows can be formed by ejecting the gas from the three gas ejection ports (the first, second and third gas ejection ports), and the one major surface of the substrate can be covered with the three gas-flows. This makes it possible to reliably protect the one major surface of the substrate, and further improves the cleanliness of the substrate.

The gas ejection nozzle and the gas supply unit may be designed so that the gas is ejected at substantially the same flow rate from the second gas ejection port and from the third gas ejection port.

In this case, the gas ejected from the second gas ejection port has substantially the same flow rate as the gas ejected from the third gas ejection port.

Therefore, the three layered gas-flows spreading radially from the vicinity of the center portion of the substrate over the one major surface of the substrate can be maintained to reach the peripheral portion of the substrate. Thus, the one major surface of the substrate can be reliably covered with the three gas-flows. This prevents the foreign matter such as particles and the droplets and the mist of the treatment liquid from adhering to the peripheral portion of the substrate.

The gas ejection nozzle may be designed so that the gas is ejected at a lower flow rate from the first gas ejection port than from the second gas ejection port.

The substrate holding unit may be designed so as to horizontally hold the substrate, and the gas ejection nozzle may be designed so that the gas is ejected horizontally from the first and second gas ejection ports.

As will be described later, the cleanliness of the substrate can be further improved by employing the gas ejection nozzle and the gas supply unit in combination or by employing the substrate holding unit and the gas ejection nozzle in combination.

The foregoing and other objects, features and effects of the present invention will become more apparent from the following detailed description of the preferred embodiments with reference to the attached drawings.

DETAILED DESCRIPTION OF PREFERRED EMBODIMENTS

Figure 1:
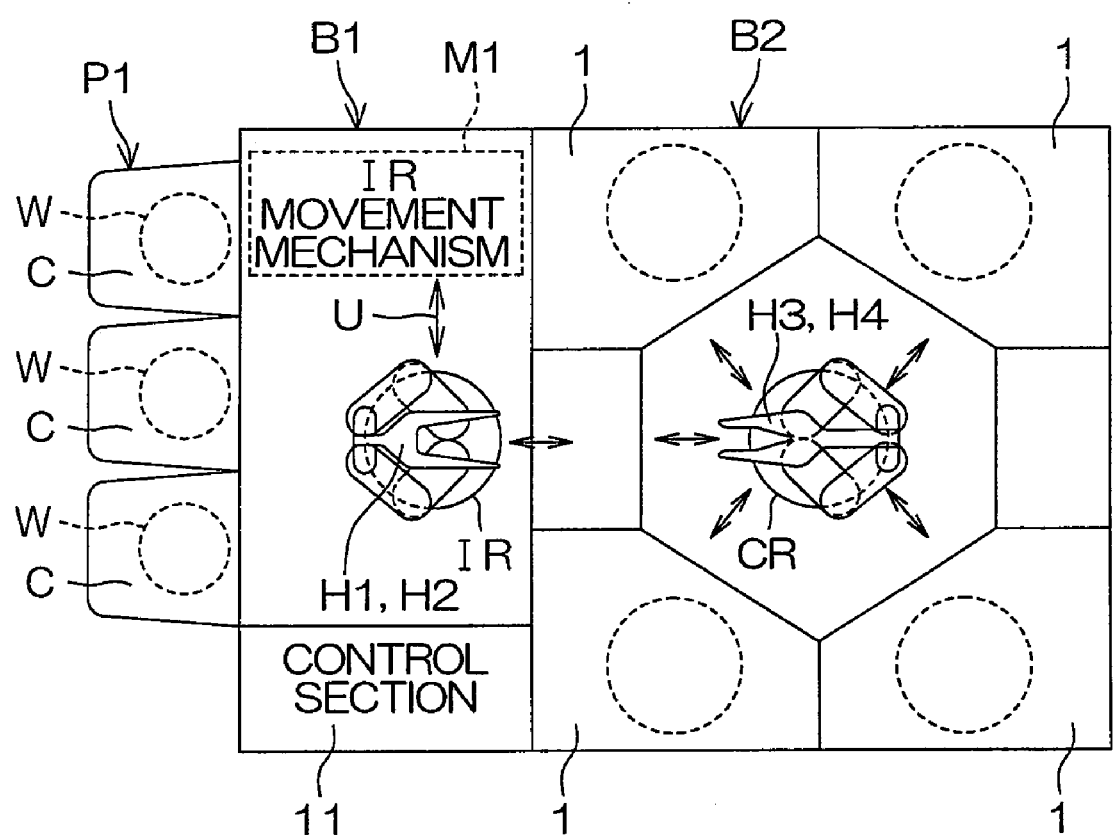
FIG. 1 is a schematic plan view showing a layout in a substrate treatment apparatus according to a first embodiment of the present invention.

FIG. 1 is a schematic plan view showing a layout in a substrate treatment apparatus according to a first embodiment of the present invention.

The substrate treatment apparatus is of a single substrate treatment type which is adapted to treat a single substrate W (a semiconductor wafer or the like) at a time. The substrate treatment apparatus is capable of performing a variety of treatments on the substrate W. The substrate treatment apparatus includes an indexer block B1, and a treatment block B2 connected to the indexer block B1.

The indexer block B1 includes a carrier retaining portion P1, an indexer robot IR, and an indexer robot movement mechanism M1 (hereinafter referred to as "IR movement mechanism M1"). The carrier retaining portion P1 is capable of retaining carriers C each accommodating a plurality of substrates W. The carriers C are retained by the carrier retaining portion P1 as being aligned in a predetermined alignment direction U (hereinafter referred to as "carrier alignment direction U"). The IR movement mechanism M1 is capable of horizontally moving the indexer robot IR along the carrier alignment direction U.

The indexer robot IR includes a first upper hand H1 attached to a distal end of a first upper arm, and a first lower hand H2 attached to a distal end of a first lower arm. The first upper hand H1 and the first lower hand H2 are disposed at different height positions in a vertically offset manner so as not to interfere with each other. In FIG. 1, the first upper hand H1 and the first lower hand H2 are illustrated as vertically overlapping each other. The indexer robot IR is capable of holding the substrate W by means of its hands H1, H2. The indexer robot IR is brought into opposed relation to any one of the carriers C to perform a loading operation for loading a treated substrate W into the carrier C and an unloading operation for unloading an untreated substrate W from the carrier C.

On the other hand, the treatment block B2 includes a plurality of treatment units 1 which are each capable of treating a single wafer W at a time, and a center robot CR. In this embodiment, eight treatment units 1, for example, are provided, each two of which are vertically stacked. These treatment units 1 are disposed around the center robot CR as seen in plan (in FIG. 1, only four upper treatment units 1 are shown). The treatment units leach perform a cleaning operation or the like on the substrate W.

The center robot CR includes a second upper hand H3 attached to a distal end of a second upper arm, and a second lower hand H4 attached to a distal end of a second lower arm. The second upper hand H3 and the second lower hand H4 are disposed at different height positions in a vertically offset manner so as not to interfere with each other. In FIG. 1, the second upper hand H3 and the second lower hand H4 are illustrated as vertically overlapping each other. The center robot CR is capable of holding the substrate W by means of its hands H3, H4.

The center robot CR is capable of performing a loading operation for loading an untreated substrate W into any one of the treatment units 1, and performing an unloading operation for unloading a treated substrate W from any one of the treatment units 1. Further, the center robot CR is capable of receiving an untreated substrate W from the indexer robot IR, and transferring a treated substrate W to the indexer robot IR.

An untreated substrate W accommodated in any one of the carriers C is held and unloaded from the carrier C by the indexer robot IR. Then, the untreated substrate W is transferred from the indexer robot IR to the center robot CR, and loaded into any one of the treatment units 1 by the center robot CR. Substrates W transferred to the center robot CR from the indexer robot IR are sequentially loaded into the respective treatment units 1 by the center robot CR.

On the other hand, the substrate W treated in the treatment unit 1 is unloaded from the treatment unit 1 by the center robot CR, and then transferred from the center robot CR to the indexer robot IR to be loaded into the carrier C by the indexer robot IR. The center robot CR sequentially unloads the treated substrates W from the respective treatment units 1. In this manner, the substrates W are treated.

Figure 2:
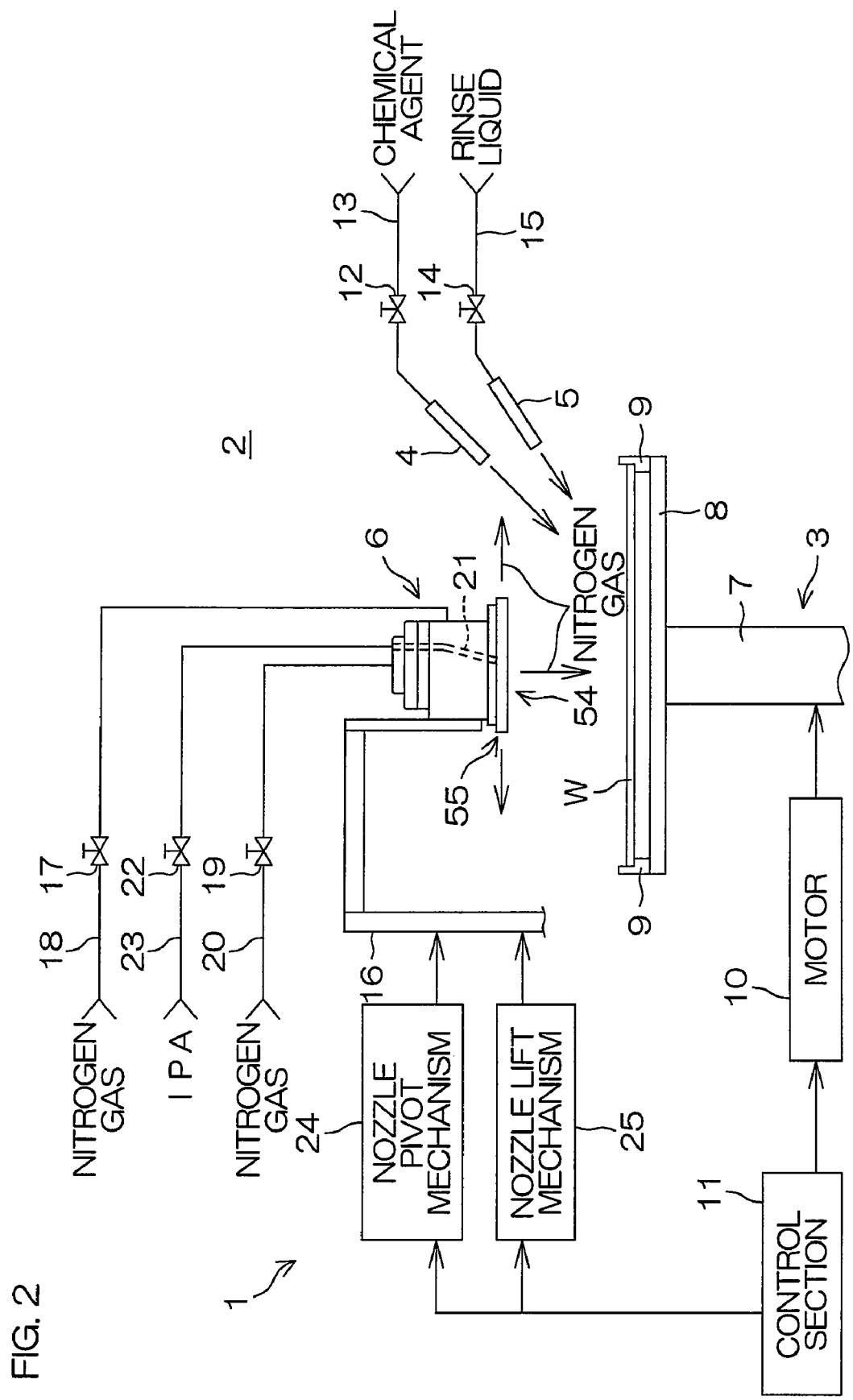
FIG. 2 is a schematic diagram showing the schematic construction of each treatment unit provided in the substrate treatment apparatus according to the first embodiment of the present invention.

FIG. 2 is a schematic diagram showing the schematic construction of each of the treatment units 1 provided in the substrate treatment apparatus according to the first embodiment of the present invention.

The treatment units 1 each include a spin chuck 3 (substrate holding unit) which horizontally holds and rotates a single substrate W, a chemical agent nozzle 4 which supplies a chemical agent as a treatment liquid onto an upper surface of the substrate W held by the spin chuck 3, a rinse liquid nozzle 5 which supplies a rinse liquid as a treatment liquid onto the upper surface of the substrate W held by the spin chuck 3, and a gas ejection nozzle 6 which ejects a gas onto the substrate W. The spin chuck 3, the chemical agent nozzle 4, the rinse liquid nozzle 5 and the gas ejection nozzle 6 are provided in a treatment chamber 2 defined by a partition wall not shown.

The spin chuck 3 includes a vertically extending rotation shaft 7, a disk-shaped spin base 8 horizontally attached to an upper end of the rotation shaft 7, a plurality of holder members 9 (holding members) provided on the spin base 8, and a motor 10 (rotation unit) connected to the rotation shaft 7. The holder members 9 are provided on a peripheral portion of an upper surface of the spin base 8 in circumferentially properly spaced relation so as to be disposed in association with an outer peripheral shape of the substrate W. The spin chuck 3 horizontally holds the substrate W above the spin base 8 with its holder members 9 holding the substrate W in abutment against a peripheral surface of the substrate W. By inputting a driving force of the motor 10 to the rotation shaft 7 with the substrate W thus held by the holder members 9, the substrate W is rotated about a vertical axis extending through the center of the substrate W. The motor 10 is controlled by a control section 11 (see FIGS. 1 and 2).

The construction of the spin chuck 3 is not limited to the aforementioned one, but may be of a vacuum suction type (vacuum chuck) which is adapted to horizontally hold the substrate W by vacuum suction of a lower surface (rear surface) of the substrate W and be rotated about the vertical axis in this state to rotate the thus held substrate W.

The chemical agent nozzle 4 is disposed at a higher position than the spin chuck 3 with its spout directing downward. The chemical agent is supplied into the chemical agent nozzle 4 from a chemical agent supply source not shown through a chemical agent supply pipe 13 provided with a chemical agent valve 12. The chemical agent nozzle 4 is capable of spouting the chemical agent supplied from the chemical agent supply source onto the upper surface of the substrate W held by the spin chuck 3. Thus, the chemical agent is supplied onto the upper surface of the substrate W.

Similarly, the rinse liquid nozzle 5 is disposed at a higher position than the spin chuck 3 with its spout directing downward. The rinse liquid is supplies into the rinse liquid nozzle 5 from a rinse liquid supply source not shown through a rinse liquid supply pipe 15 provided with a rinse liquid valve 14. The rinse liquid nozzle 5 is capable of spouting the rinse liquid supplied from the rinse liquid supply source onto the upper surface of the substrate W held by the spin chuck 3. Thus, the rinse liquid is supplied onto the upper surface of the substrate W.

Examples of the chemical agent to be supplied into the chemical agent nozzle 4 include solutions containing at least one of sulfuric acid, acetic acid, nitric acid, hydrochloric acid, hydrofluoric acid, ammonia water, hydrogen peroxide water, organic acids such as citric acid and oxalic acid, organic alkalis such as TMAH (tetramethylammonium hydroxide), surface active agents and corrosion inhibitors. Examples of the rinse liquid to be supplied into the rinse liquid nozzle 5 include deionized water, carbonated water, electrolytic ion water, hydrogen water, ozone water and hydrochloric acid aqueous solutions having very low concentrations (e.g., about 10 to about 100 ppm).

The gas ejection nozzle 6 is a cylindrical member having a smaller diameter than the substrate W held by the spin chuck 3. The gas ejection nozzle 6 is supported above the spin chuck 3 by a support arm 16 with its center axis extending vertically. The gas ejection nozzle 6 is capable of ejecting the gas generally horizontally and radially thereof, and ejecting the gas downward. A first gas supply pipe 18 (gas supply unit) provided with a first gas valve 17 and a second gas supply pipe 20 provided with a second gas valve 19 are connected to the gas ejection nozzle 6. The gas is supplied into the gas ejection nozzle 6 from a gas supply source not shown through the gas supply pipes 18, 20. An example of the gas to be supplied into the gas ejection nozzle 6 is nitrogen gas which is an exemplary inert gas. The gas is not limited to the inert gas, but dry air, clean air (cleaned air) or other type of gas may be used as the gas.

A treatment liquid nozzle 21 which spouts a treatment liquid is attached to the gas ejection nozzle 6. The treatment liquid nozzle 21 is partly disposed in the gas ejection nozzle 6. A treatment liquid supply pipe 23 provided with a treatment liquid valve 22 is connected to the treatment liquid nozzle 21. The treatment liquid is supplied into the treatment liquid nozzle 21 from a treatment liquid supply source not shown through the treatment liquid supply pipe 23. An example of the treatment liquid to be supplied into the treatment liquid nozzle 21 is IPA (isopropyl alcohol). The IPA is an exemplary organic solvent which is more volatile than the deionized water, and the deionized water is highly soluble in the IPA. The treatment liquid nozzle 21 is capable of spouting the IPA downward. Other examples of the organic solvent more volatile than the deionized water include liquids containing at least one of HFE (hydrofluoroether), methanol, ethanol, acetone and trans-1,2-dichloroethylene. These organic solvents may be used either alone or in combination with other component. For example, a liquid mixture of the IPA and the deionized water or a liquid mixture of the IPA and the HFE may be used as the treatment liquid.

The support arm 16 is pivotal about a vertical pivot axis provided on a lateral side of the spin chuck 3. A nozzle pivot mechanism 24 pivots the support arm 16 about the pivot axis. With the support arm 16 being pivoted by the nozzle pivot mechanism 24, the gas ejection nozzle 6 is pivoted about the pivot axis of the support arm 16 to be horizontally moved. This makes it possible to locate the gas ejection nozzle 6 above the substrate W held by the spin chuck 3 or retract the gas ejection nozzle 6 from above the spin chuck 3. The pivot axis of the support arm 16 is defined so that the gas ejection nozzle 6 can be horizontally moved along a predetermined path extending through above the center portion of the substrate W held by the spin chuck 3. Thus, the nozzle pivot mechanism 24 can position the gas ejection nozzle 6 above the center portion of the substrate W held by the spin chuck 3.

With the gas ejection nozzle 6 being located above the substrate W held by the spin chuck 3, the IPA is spouted from the treatment liquid nozzle 21 to be thereby supplied onto the upper surface of the substrate W. Further, an IPA application point on the substrate W can be moved by horizontally moving the gas ejection nozzle 6 while spouting the IPA from the treatment liquid nozzle 21 above the substrate W held by the spin chuck 3. In this embodiment, the treatment liquid nozzle 21 serves as a stationary nozzle capable of supplying the treatment liquid at a fixed treatment liquid application point on the substrate W, and serves as a scan nozzle capable of moving a treatment liquid application point over the substrate W to supply the treatment liquid over the substrate W.

Figure 5:
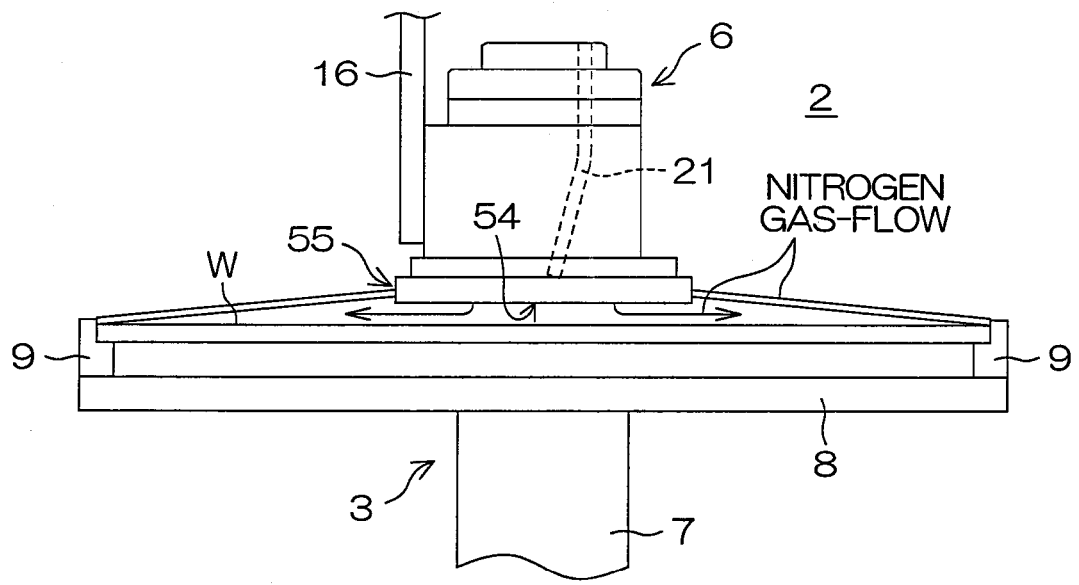
FIG. 5 is a schematic side view of a spin chuck and the gas ejection nozzle for explaining an exemplary nitrogen gas ejection state observed when nitrogen gas is ejected from a gas ejection port according to the first embodiment of the present invention.

Further, a nozzle lift mechanism 25 is connected to the support arm 16 to vertically move up and down the support arm 16. The gas ejection nozzle 6 is vertically moved up and down by vertically moving up and down the support arm 16. With the gas ejection nozzle 6 being located above the center portion of the substrate W held by the spin chuck 3, the support arm 16 is moved up and down, whereby the gas ejection nozzle 6 is moved toward the center portion of the upper surface of the substrate W and moved upward away from the substrate W. The nozzle lift mechanism 25 is capable of moving up and down the gas ejection nozzle 6 between an adjacent position (as shown in FIG. 5) at which the gas ejection nozzle 6 is located adjacent the center portion of the upper surface of the substrate W and an upper position (as shown in FIG. 2) that is higher than the adjacent position.

The nozzle pivot mechanism 24 and the nozzle lift mechanism 25 are each controlled by the control section 11. The opening and closing of the valves such as the chemical agent valve 12 provided in the treatment unit 1 is also controlled by the control section 11.

Figure 3:
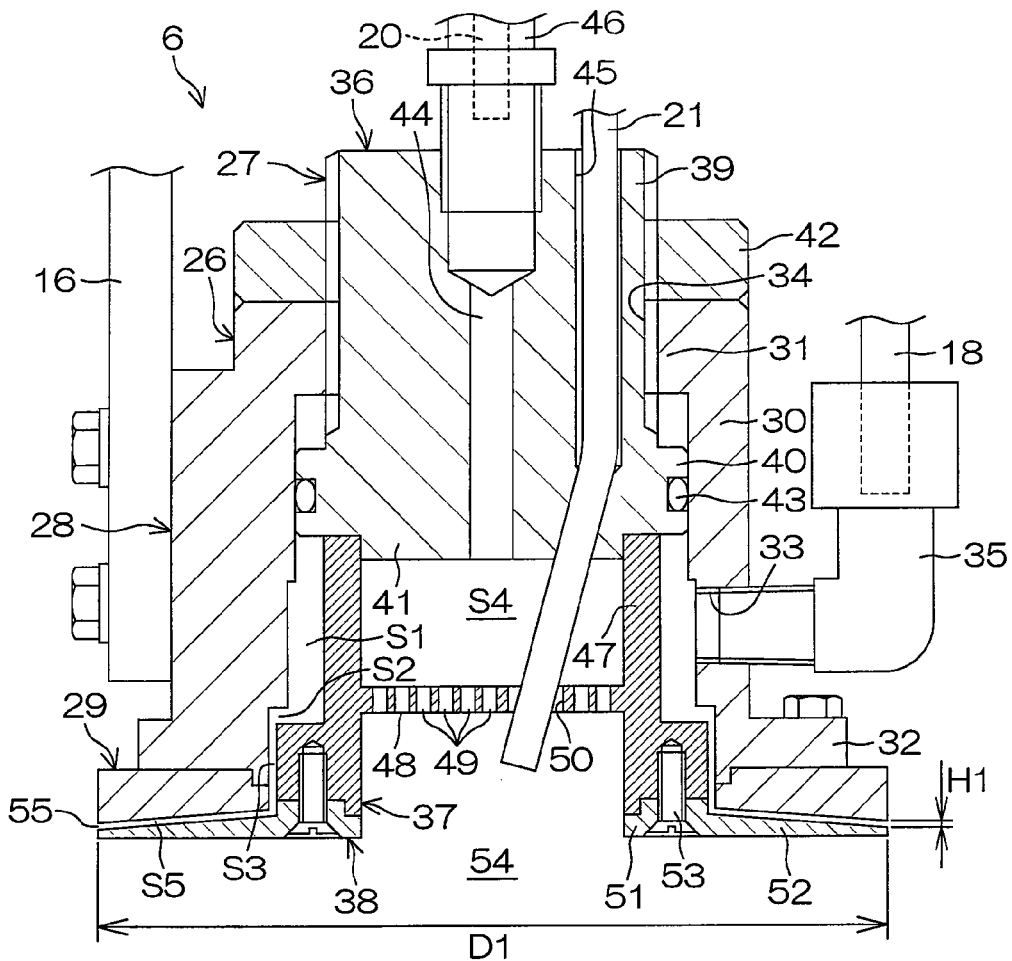
FIG. 3 is a schematic vertical sectional view of a gas ejection nozzle according to the first embodiment of the present invention.
Figure 4:
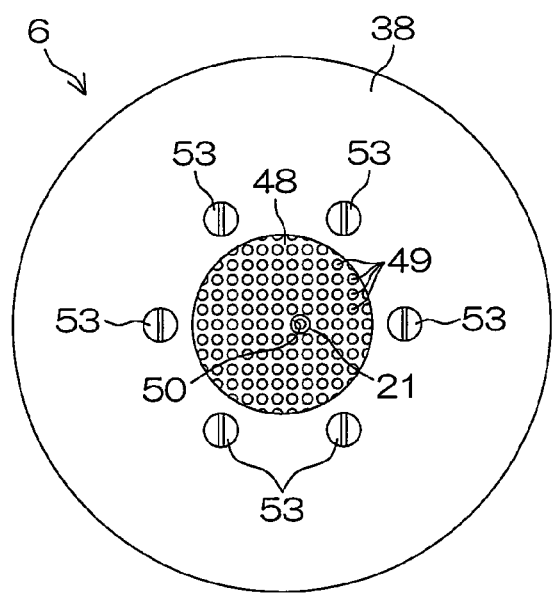
FIG. 4 is a schematic bottom view of the gas ejection nozzle according to the first embodiment of the present invention.

FIG. 3 is a schematic vertical sectional view of the gas ejection nozzle 6, and FIG. 4 is a schematic bottom view of the gas ejection nozzle 6. The structure of the gas ejection nozzle 6 will hereinafter be described more specifically with reference to FIGS. 3 and 4.

The gas ejection nozzle 6 includes a tubular outer structural member 26, and an inner structural member 27 fitted in the outer structural member 26. The outer structural member 26 is supported by the support arm 16 described above. The inner structural member 27 is held by the outer structural member 26. The outer structural member 26 includes an upper member 28 and a lower member 29, and the support arm 16 is connected to the upper member 28.

The upper member 28 has an inverted cup shape having an opening on its lower side. The upper member 28 includes a hollow cylindrical peripheral wall portion 30, an annular bottom portion 31 extending inward from one edge (an upper edge in FIG. 3) of the peripheral wall portion 30, and an annular flange portion 32 extending outward from the other edge of the peripheral wall portion 30. The upper member 28 has a first female thread hole 33 extending radially through the peripheral wall portion 30, and a second female thread hole 34 located in a center portion of the bottom portion 31. A first joint 35 is threadingly fitted in the first female thread hole 33, and the first gas supply pipe 18 is connected to the upper member 28 via the first joint 35. The inner structural member 27 is threadingly fitted in the second female thread hole 34, whereby the inner structural member 27 is connected to the outer structural member 26.

The peripheral wall portion 30 has an inner peripheral surface extending stepwise axially thereof, and has an inner diameter increased stepwise toward its lower side. In this embodiment, the inner diameter of the peripheral wall portion 30 is increased by two steps, so that the peripheral wall portion 30 has an upper end portion, an intermediate portion and a lower end portion having different inner diameters.

The lower member 29 is a plate member having an annular shape as seen in plan and connected to a lower end of the upper member 28 coaxially with the upper member 28. The lower member 29 has an inner diameter that is generally equal to the inner diameter of the lower end portion of the peripheral wall portion 30. The lower member 29 has an inner peripheral surface entirely continuous to the inner peripheral surface of the lower end portion of the peripheral wall portion 30 with no step. The lower member 29 has a lower surface gently inclined at a predetermined inclination angle downward outward (away from a center axis of the lower member 29).

On the other hand, the inner structural member 27 includes a cylindrical column member 36, a tubular member 37 and a plate member 38, and is inserted in the outer structural member 26 from the blow. The cylindrical column member 36, the tubular member 37 and the plate member 38 are disposed coaxially with each other. An upper end of the tubular member 37 is connected to a lower end of the cylindrical column member 36, and the plate member 38 is connected to a lower end of the tubular member 37. The cylindrical column member 36, the tubular member 37 and the plate member 38 are disposed coaxially with the outer structural member 26.

The cylindrical column member 36 includes a cylindrical male thread portion 39 having a male thread on an outer peripheral surface thereof, a cylindrical overhang portion 40 provided below the male thread portion 39 and having an outer peripheral surface projecting outward of the male thread portion 39, and a cylindrical projection 41 having a smaller diameter than the overhang portion 40 and projecting downward from a lower end of the overhang portion 40. The male thread portion 39, the overhang portion 40 and the projection 41 are formed integrally with each other so as to be coaxial with each other.

The male thread portion 39 is inserted in the second female thread hole 34 provided in the bottom portion 31 from the below to be threadingly fitted in the second female thread hole 34 with its upper end portion projecting upward of the bottom portion 31. A lock nut 42 is fitted around the projecting portion (the upper end portion) of the male thread portion 39, whereby the inner structural member 27 is firmly connected to the outer structural member 26.

The overhang portion 40 is located inward of an upper end portion of the upper member 28, and has an outer diameter that is slightly smaller than an inner diameter of the upper end portion of the upper member 28 (the inner diameter of the upper end portion of the peripheral wall portion 30). The overhang portion 40 has an annular groove formed circumferentially in the outer peripheral surface thereof. An O-ring 43 is accommodated as a sealing member in the annular groove. A gap between the upper member 28 and the overhang portion 40 is sealed with the O-ring 43.

The cylindrical column member 36 has two through-holes (a center through-hole 44 and a nozzle insertion hole 45) each extending axially thereof. The center through-hole 44 extends along a center axis of the cylindrical column member 36, while the nozzle insertion hole 45 is provided apart from the center axis of the cylindrical column member 36.

The center through-hole 44 has an upper end portion formed with a female thread, and the second gas supply pipe 20 is connected to the cylindrical column member 36 via a second joint 46 threaded with the female thread. The center through-hole 44 has a lower end which opens in a center portion of a lower surface of the cylindrical column member 36. Nitrogen gas supplied into the center through-hole 44 from the second gas supply pipe 20 is spouted downward from the lower end of the center through-hole 44.

The nozzle insertion hole 45 extends vertically downward from an upper end of the cylindrical column member 36, and has a lower end portion inclined toward the center axis of the cylindrical column member 36. The treatment liquid nozzle 21 is inserted in the nozzle insertion hole 45, and partly inclined toward the center axis of the cylindrical column member 36 along the lower end portion of the nozzle insertion hole 45. A portion of the treatment liquid nozzle 21 projects downward from the cylindrical column member 36 to be located inside the tubular member 37.

The tubular member 37 includes a hollow cylindrical portion 47 having an upper edge connected to the cylindrical column member 36, and a disk-shaped partition plate 48 which partitions an inside space of the hollow cylindrical portion 47 axially of the hollow cylindrical portion 47. The hollow cylindrical portion 47 has a constant inner diameter over the entire length from its upper end to its lower end, and its upper end portion is fitted around the projection 41. Further, upper and intermediate portions of the hollow cylindrical portion 47 have a constant outer diameter, and a lower end portion of the hollow cylindrical portion 47 has a greater outer diameter than the other portions. Therefore, the hollow cylindrical portion 47 has an outer peripheral surface extending axially stepwise.

The hollow cylindrical portion 47 is accommodated in the outer structural member 26, and the outer peripheral surface of the hollow cylindrical portion 47 is entirely spaced from an inner peripheral surface of the outer structural member 26. More specifically, an upper cylindrical space S1, an annular space S2 extending horizontally outward from a lower edge of the upper cylindrical space S1, and a lower cylindrical space S3 extending vertically downward from an outer periphery of the annular space S2 are defined between the hollow cylindrical portion 47 and the outer structural member 26.

The nitrogen gas from the first gas supply pipe 18 is supplied into the upper cylindrical space S1 from a predetermined peripheral position. The nitrogen gas supplied from the first gas supply pipe 18 circumferentially flows in the upper cylindrical space S1 to spread throughout the upper cylindrical space S1. The nitrogen gas, after spreading throughout the upper cylindrical space S1, flows into the annular space S2 from the upper cylindrical space S1 and further flows into the lower cylindrical space S3 from the annular space S2. Then, as will be described later, the nitrogen gas flowing into the lower cylindrical space S3 is ejected radially outward from a lower edge (gas ejection port 55) of the gas ejection nozzle 6.

As shown in FIG. 3, the thickness of the upper cylindrical space S1 (as measured radially at any circumferential position) is significantly greater than the thickness of the annular space S2 (as measured vertically) and the thickness of the lower cylindrical space S3. The thickness of the annular space S2 is substantially equal to the thickness of the lower cylindrical space S3. That is, the area of a nitrogen gas flow passage defined between the hollow cylindrical portion 47 and the outer structural member 26 is significantly reduced at a junction between the upper cylindrical space S1 and the annular space S2, and kept generally constant downstream of the junction. Therefore, the nitrogen gas can be supplied circumferentially evenly into the annular space S2 and the lower cylindrical space S3 from the upper cylindrical space S1. Further, the nitrogen gas flows at a higher flow rate in the annular space S2 and the lower cylindrical space S3 than in the upper cylindrical space S1. Thus, the nitrogen gas can be swiftly and isotropically ejected (jetted) at a generally constant flow rate outward from the lower edge (gas ejection port 55) of the gas ejection nozzle 6.

The partition plate 48 is formed integrally with the hollow cylindrical portion 47. The inside space of the hollow cylindrical portion 47 is axially partitioned at the intermediate portion thereof by the partition plate 48. As shown in FIG. 4, the partition plate 48 has a multiplicity of through-holes 49 provided in the entire portion thereof as each having a smaller diameter, so that the gas can pass thicknesswise through the partition plate 48. The partition plate 48 further has a nozzle insertion hole 50 provided in the vicinity of the center thereof for insertion of the treatment liquid nozzle 21. A lower end portion of the treatment liquid nozzle 21 extends through the nozzle insertion hole 50 to be located below the partition plate 48, but does not project downward from the plate member 38. The treatment liquid nozzle 21 ejects the IPA below the partition plate 48.

An upper space S4 defined above the partition plate 48 in the inside space of the hollow cylindrical portion 47 communicates with the center through-hole 44 as shown in FIG. 3. Therefore, the nitrogen gas supplied into the gas ejection nozzle 6 from the second gas supply pipe 20 flows into the upper space S4 through the center through-hole 44. Then, the nitrogen gas is retained in the upper space S4. The retained nitrogen gas is ejected downward through the multiplicity of through-holes 49 provided in the partition plate 48. The nitrogen gas can be ejected at an even flow rate from the respective through-holes 49 by thus retaining the nitrogen gas in the upper space S4. The flow passage area of the upper space S4 is greater than the flow passage area of the center through-hole 44. Therefore, the pressure of the nitrogen gas is reduced when the nitrogen gas flows from the center through-hole 44 into the upper space S4. Thus, the nitrogen gas can be gently ejected from the respective through-holes 49.

As shown in FIG. 4, the plate member 38 is an annular plate member as seen in plan. The plate member 38 includes an annular connection portion 51 and an annular flange portion 52. The flange portion 52 has a smaller thickness than the connection portion 51 and extends outward from an outer periphery of the connection portion 51. A plurality of flat head screws 53 are attached to the connection portion 51 from the below, and the plate member 38 is connected to the lower end of the tubular member 37 by the flat head screws 53. Heads of the flat heat screws 53 are accommodated in the connection portion 51 so as not to project downward from a lower surface of the plate member 38.

The plate member 38 (connection portion 51) has an inner diameter that is substantially equal to the inner diameter of the hollow cylindrical portion 47. The plate member 38 has an inner peripheral surface entirely continuous to an inner peripheral surface of the hollow cylindrical portion 47 with no step. The connection portion 51 has an outer diameter that is substantially equal to the outer diameter of the lower end portion of the hollow cylindrical portion 47. The connection portion 51 has an outer peripheral surface entirely continuous to the outer peripheral surface of the lower end portion of the hollow cylindrical portion 47 with no step. Further, the plate member 38 (flange portion 52) has an outer diameter that is substantially equal to an outer diameter of the lower member 29. The plate member 38 and the lower member 29 are disposed coaxially with each other.

The lower surface of the plate member 38 (lower surfaces of the connection portion 51 and the flange portion 52) is an annular flat surface extending along a horizontal plane, and is located at the lowermost end of the gas ejection nozzle 6. The nitrogen gas supplied into the gas ejection nozzle 6 from the second gas supply pipe 20 flows through the center through-hole 44 and an inside space of the tubular member 37 to be ejected downward from a center portion of the lower surface of the plate member 38. An opening provided in the center portion of the lower surface of the plate member 38 serves as a lower surface ejection port 54 through which the nitrogen gas is ejected downward.

The flange portion 52 has an upper surface gently inclined at a predetermined inclination angle downward outward (away from a center axis of the plate member 38). The inclination angle of the upper surface of the flange portion 52 is substantially equal to the inclination angle of the lower surface of the lower member 29. The upper surface of the flange portion 52 and the lower surface of the lower member 29 are vertically spaced a predetermined distance from each other in opposed relation. An annular space S5 is defined between the flange portion 52 and the lower member 29 as being gently inclined downward outward at a predetermined inclination angle. The annular space S5 extends outward from a lower edge of the lower cylindrical space S3 to communicate with the lower cylindrical space S3.

The nitrogen gas supplied into the gas ejection nozzle 6 from the first gas supply pipe 18 flows through the space defined between the outer structural member 26 and the tubular member 37 (the upper cylindrical space S1, the annular space S2 and the lower cylindrical space S3) to be supplied into the annular space S5, and flows outward in the annular space S5. Then, the nitrogen gas is ejected from an outer periphery of the annular space S5 outward of the gas ejection nozzle 6. Since the annular space S5 is inclined downward outward, the nitrogen gas is ejected obliquely downward from the outer periphery of the annular space S5. The outer periphery of the annular space S5 annularly opens in an outer peripheral surface of the gas ejection nozzle 6 to serve as the gas ejection port 55. The upper cylindrical space S1, the annular space S2, the lower cylindrical space S3 and the annular space S5 are collectively defined as a gas flow passage through which the gas flows.

The gas ejection port 55 is located at the lower edge of the gas ejection nozzle 6, and extends entirely around the lower edge. Therefore, the nitrogen gas is ejected from the gas ejection nozzle 6 in any horizontal direction over 360 degrees about the gas ejection nozzle 6. As shown in FIG. 3, the gas ejection port 55 has a smaller width (as measured vertically). Further, the gas ejection port 55 is a slit-like ejection port extending circumferentially along the outer peripheral surface (side surface) of the gas ejection nozzle 6, so that the nitrogen gas can be swiftly ejected (jetted) from the gas ejection port 55 without reduction in flow rate.

The width of the gas ejection port 55 is adjusted by axially moving the outer structural member 26 and the inner structural member 27 relative to each other. More specifically, the lock nut 42 is loosened, and the second female thread hole 34 and the male thread portion 39 are rotated relative to each other to change the width of the gas ejection port 55. Then, the lock nut 42 is tightened again, whereby the width of the gas ejection port 55 is fixed.

Figure 6:
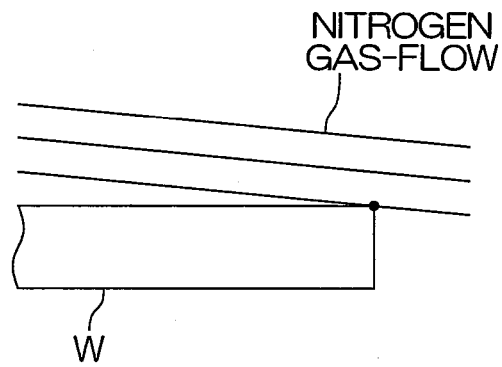
FIG. 6 is a schematic enlarged view of a peripheral portion of a substrate observed when the nitrogen gas is applied onto the substrate.
Figure 7:
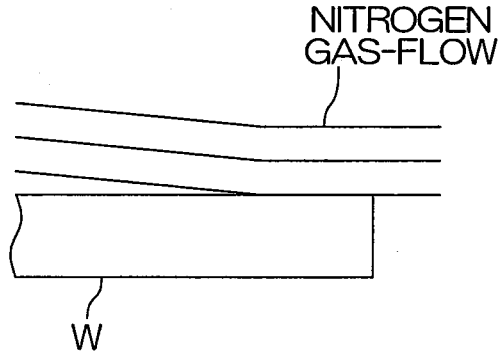
FIG. 7 is a schematic enlarged view of the peripheral portion of the substrate observed when the nitrogen gas is applied onto the substrate.

FIG. 5 is a schematic side view of the spin chuck 3 and the gas ejection nozzle 6 for explaining an exemplary nitrogen gas ejection state observed when the nitrogen gas is ejected from the gas ejection port 55. FIGS. 6 and 7 are schematic enlarged views of a peripheral portion of the substrate W observed when the nitrogen gas is applied onto the substrate.

By ejecting the nitrogen gas from the gas ejection port 55, a nitrogen gas-flow (nitrogen gas stream) is formed as spreading generally horizontally and radially about the gas ejection nozzle 6. The nitrogen gas ejected from the gas ejection port 55 spreads in the form of laminar flow, so that the nitrogen gas-flow (gas curtain) is formed around the gas ejection nozzle 6 as having a generally even thickness that is equivalent to the width of the gas ejection port 55. By thus ejecting the nitrogen gas from the gas ejection port 55 with the gas ejection nozzle 6 being located adjacent the center portion of the upper surface of the substrate W, the nitrogen gas-flow is formed over the upper surface of the substrate W. Thus, the upper surface of the substrate W is covered with the nitrogen gas-flow (gas curtain).

In this embodiment, as shown in FIG. 5, the nitrogen gas is ejected radially from the gas ejection port 55 obliquely downward toward a peripheral portion of the upper surface of the substrate W held by the spin chuck 3 with the gas ejection nozzle 6 being located above the center portion of the substrate W. Therefore, the nitrogen gas-flow is formed around the gas ejection nozzle 6 as having a generally conical shape expanding downward from the gas ejection nozzle 6. The nitrogen gas ejected from the gas ejection port 55 maintains the laminar flow to reach the peripheral portion of the upper surface of the substrate W, and encloses a space defined between the gas ejection nozzle 6 and the substrate W. Therefore, the space between the gas ejection nozzle 6 and the substrate W is isolated from an ambient space by the nitrogen gas-flow. Further, the upper surface of the substrate W held by the spin chuck 3 is entirely covered with the gas ejection nozzle 6 and the nitrogen gas-flow.

With the entire upper surface of the substrate W being covered with the gas ejection nozzle 6 and the nitrogen gas-flow, the substrate W can be protected from foreign matter such as particles falling onto the upper surface of the substrate W. Further, mist of the treatment liquid drifting in the treatment chamber 2 is substantially prevented from reaching the upper surface of the substrate W and adhering to the upper surface of the substrate W. This suppresses or prevents contamination of the substrate W. The space between the gas ejection nozzle 6 and the substrate W is isolated from the ambient space, whereby the foreign matter such as particles and the mist of the treatment liquid is substantially prevented from intruding into the space between the gas ejection nozzle 6 and the substrate W. This further reliably suppresses or prevents the adhesion of the foreign matter such as particles and the mist of the treatment liquid to the substrate W.

With the gas ejection nozzle 6 being located above the center portion of the substrate W, the nitrogen gas is ejected radially from the gas ejection port 55 and ejected downward from the lower surface ejection port 54, whereby air is expelled from a space enclosed by the nitrogen gas-flow. In this manner, an atmosphere present above the substrate W is replaced with a nitrogen gas atmosphere (nitrogen gas purge). Thus, the substrate W can be treated in the nitrogen gas atmosphere present above the substrate W.

When the nitrogen gas is ejected from the gas ejection port 55 above the center portion of the substrate W, the ejected nitrogen gas may be allowed to flow in the form of laminar flow to hit the outer periphery (indicated by a black dot in FIG. 6) of the upper surface of the substrate W as shown in FIG. 6 or pass in the vicinity of the outer periphery of the upper surface of the substrate W without hitting the outer periphery. Alternatively, as shown in FIG. 7, the ejected nitrogen gas may be applied in the form of laminar flow onto the peripheral portion of the upper surface of the substrate W to spread horizontally over the peripheral portion of the upper surface. Where the ejected nitrogen gas hits the outer periphery of the upper surface of the substrate W and where the ejected nitrogen gas is applied onto the peripheral portion of the upper surface of the substrate W, the space above the substrate W is enclosed by the gas ejection nozzle 6 and the nitrogen gas-flow. This substantially prevents the foreign matter such as particles and the mist of the treatment liquid from intruding into the space above the substrate W from the ambient space, thereby more reliably suppressing or preventing the contamination of the substrate W.

Even if the substrate W is held by the spin chuck 3 with its front surface (device formation surface) facing up when the nitrogen gas is applied to the outer periphery of the upper surface of the substrate W or to the peripheral portion of the upper surface of the substrate W, the portion of the substrate W to which the nitrogen gas is applied is a device non-formation region outside the device formation region. Therefore, it is possible to treat the substrate W without influencing the quality of the substrate W. Where the substrate W is held by the spin chuck 3 with its rear surface (device non-formation surface) facing up, of course, the nitrogen gas applied to the outer periphery or the peripheral portion of the upper surface of the substrate W does not influence the quality of the substrate W.

With reference to FIG. 3, specific numeric values to be employed for the dimensions of the respective components and the like when the nitrogen gas is to be applied to a peripheral portion of an upper surface of a round substrate having a diameter of 300 mm are shown below by way of example. The gas ejection port 55 is a circular port having a height (width) H1 of 4 mm to 6 mm, preferably 4 mm, and a diameter D1 of 100 mm. The gas ejection port 55 has a lower edge located at a height level that is higher by 1 mm than the lower surface of the gas ejection nozzle 6 (the lower surface of the plate member 38). The annular space S5 is inclined downward outward at an inclination angle of not greater than 5 degrees with respect to the lower surface of the gas ejection nozzle 6, so that the nitrogen gas is ejected from the gas ejection port 55 obliquely downward toward the peripheral portion of the upper surface of the substrate W at an ejection angle of not greater than 5 degrees. Further, the center axis of the gas ejection port 55 is aligned with the rotation axis of the substrate W, and the nitrogen gas is ejected with the lower surface of the gas ejection nozzle 6 being vertically spaced 4 mm from the upper surface of the substrate W. At this time, the ejection flow rate of the nitrogen gas is set at 300 L/min where the height of the gas ejection port 55 is 4 mm.

The nitrogen gas ejected from the gas ejection port 55 under these conditions spreads radially with its flow thickness kept substantially unchanged, and maintains its laminar flow to reach the peripheral portion of the upper surface of the substrate W. Then, as shown in FIG. 7, the nitrogen gas is applied onto the peripheral portion of the upper surface of the substrate W, and horizontally spreads over the peripheral portion of the upper surface of the substrate W. Therefore, a portion of the upper surface of the substrate W inward of the peripheral portion is covered with the gas ejection nozzle 6 and the nitrogen gas-flow with a space being defined thereon. The peripheral portion of the upper surface of the substrate W is covered with the nitrogen gas-flow which flows over the peripheral portion.

Where the aforementioned conditions are employed, the height H1 of the gas ejection port 55 is not necessarily required to be 4 mm to 6 mm. If the height H1 of the gas ejection port 55 is increased, the ejection flow rate of the nitrogen gas should be increased to keep the flow rate of the nitrogen gas at a predetermined level or higher in order to cause the nitrogen gas-flow to reach the peripheral portion of the upper surface of the substrate W. Therefore, the increase in the height H1 of the gas ejection port 55 increases the consumption of the nitrogen gas. For reduction of the consumption of the nitrogen gas, the height H1 of the gas ejection port 55 is preferably not greater than 6 mm. If the height H1 of the gas ejection port 55 is less than 4 mm, the nitrogen gas-flow has a reduced thickness, thereby failing to reach the peripheral portion of the upper surface of the substrate W. In order to reliably cover the entire upper surface of the substrate W, the height H1 of the gas ejection port 55 is preferably not less than 4 mm. In consideration of these points, the height H1 of the gas ejection port 55 is optimally 4 mm where the aforementioned conditions are employed.

The ejection angle of the nitrogen gas from the gas ejection port 55 is not necessarily required to be not greater than 5 degrees. Where the nitrogen gas is ejected from the gas ejection port 55 obliquely downward toward the peripheral portion of the upper surface of the substrate W, the vertical distance between the substrate W and the gas ejection nozzle 6 is increased as the ejection angle is increased. If the nitrogen gas is ejected at a greater ejection angle from the gas ejection port 55, the space defined between the gas ejection nozzle 6 and the substrate W is increased. Therefore, when the atmosphere between the substrate W and the gas ejection nozzle 6 is purged with the nitrogen gas, the nitrogen gas should be supplied at a greater flow rate. In order to purge the atmosphere between the substrate W and the gas ejection nozzle 6 with the nitrogen gas by supplying the nitrogen gas at a lower flow rate, the ejection angle of the nitrogen gas from the gas ejection port 55 is preferably not greater than 5 degrees.

Figure 8:
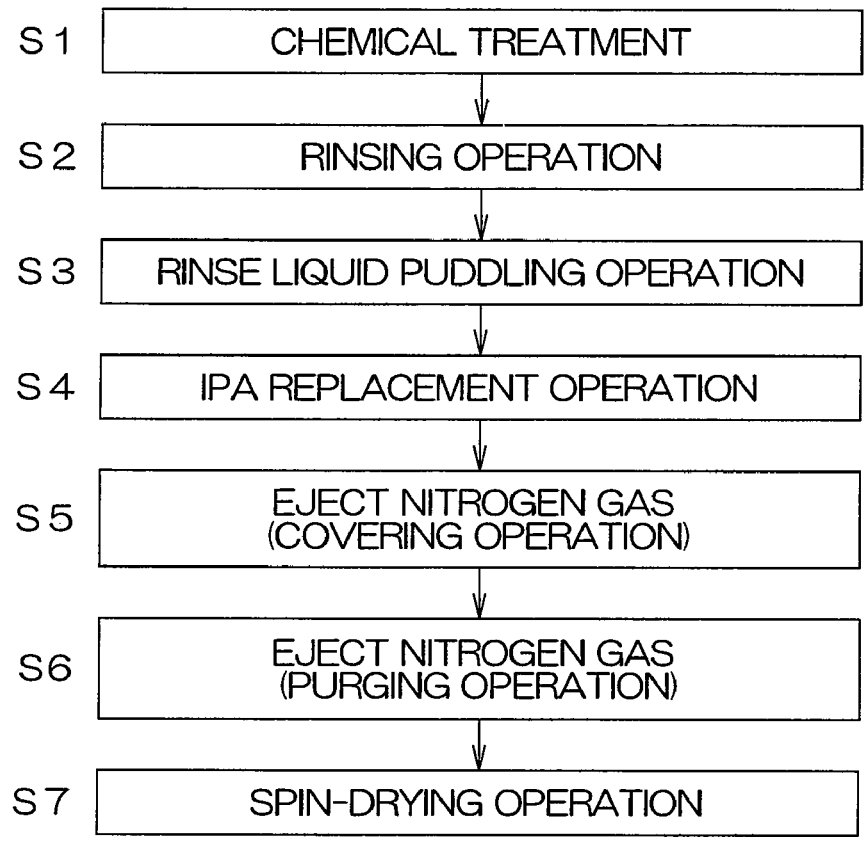
FIG. 8 is a process diagram for explaining an exemplary substrate treatment process to be performed by the substrate treatment apparatus according to the first embodiment of the present invention.

FIG. 8 is a process diagram for explaining an exemplary substrate treatment process to be performed by the substrate treatment apparatus. With reference to FIGS. 2, 5 and 8, the exemplary substrate treatment process will hereinafter be described.

An untreated substrate W is transported into the treatment chamber 2 by a transport robot not shown, and transferred to the spin chuck 3 with its front surface (device formation surface) facing up. When the substrate W is transported into the treatment chamber 2, components such as the gas ejection nozzle 6 are retracted from above the spin chuck 3 in the treatment chamber 2 so as not to bump against the transport robot and the substrate W.

Then, a chemical treatment is performed to treat the front surface of the substrate W with hydrofluoric acid as a chemical agent (Step S1). More specifically, the control section 11 controls the motor 10 to rotate the substrate W held by the spin chuck 3 at a predetermined rotation speed. Then, the control section 11 opens the chemical agent valve 12 to spout the hydrofluoric acid from the chemical agent nozzle 4 toward the upper surface of the substrate W. The spouted hydrofluoric acid is applied onto the upper surface of the substrate W, and receives a centrifugal force generated by the rotation of the substrate W to spread outward over the substrate W. Thus, the hydrofluoric acid is supplied to the entire upper surface of the substrate W, whereby the chemical treatment is performed on the front surface of the substrate W.

In turn, a rinsing operation is performed to rinse the front surface of the substrate W with deionized water as a rinse liquid (Step S2). More specifically, the control section 11 closes the chemical agent valve 12, and then opens the rinse liquid valve 14 to spout the deionized water from the rinse liquid nozzle 5 toward the upper surface of the substrate W being rotated. Thus, the deionized water is supplied to the entire upper surface of the substrate W, whereby the hydrofluoric acid is rinsed away from the substrate W by the deionized water. Thus, the rinsing operation is performed on the front surface of the substrate W.

Subsequently, a puddling operation is performed to treat the substrate W with a deionized water film retained on the substrate W (Step S3). More specifically, the control section 11 controls the motor 10 to keep the substrate W in a halt state or to keep the substrate W in a lower speed rotation state (for example, to rotate the substrate W at a rotation speed of about 10 to about 30 rpm) while continuously spouting the deionized water from the rinse liquid nozzle 5. With the substrate W kept in the halt state or in the lower speed rotation state, the amount of the deionized water removed from the substrate W is reduced, so that the deionized water is retained on the substrate W (liquid puddling). Thus, the deionized water film is formed on the substrate W, whereby the entire upper surface of the substrate W is covered with the water film.

After a lapse of a predetermined period from the start of the halt state or the lower speed rotation state of the substrate W, the control section 11 stops spouting the deionized water from the rinse liquid nozzle 5. Then, the deionized water film is retained on the substrate W for a predetermined period. Thus, the puddling operation using the deionized water is performed on the front surface of the substrate W.

In turn, an IPA replacement operation is performed to replace the deionized water film with the IPA on the substrate W (Step S4). More specifically, the control section 11 closes the rinse liquid valve 14, and then controls the nozzle pivot mechanism 24 to locate the gas ejection nozzle 6 above the substrate W held by the spin chuck 3. At this time, the gas ejection nozzle 6 is located at the upper position (indicated in FIG. 2).

Subsequently, the control section 11 opens the treatment liquid valve 22 to spout the IPA from the treatment liquid nozzle 21 toward a center portion of the upper surface of the substrate W held by the spin chuck 3. While the IPA is spouted from the treatment liquid nozzle 21, the control section 11 controls the motor 10 to accelerate the rotation of the substrate W to a predetermined rotation speed from the halt state or the lower speed rotation state.

The IPA ejected from the treatment liquid nozzle 21 is applied onto the center portion of the upper surface of the substrate W, and then receives a centrifugal force generated by the rotation of the substrate W to be accelerated and move outward over the substrate W. Therefore, the deionized water film retained on the substrate W is forced to flow outward by the continuously supplied IPA, and replaced with the IPA gradually outward from the center portion of the upper surface of the substrate W. Then, the deionized water is completely removed from the substrate W to be replaced with the IPA on the substrate W. Thus, an IPA film is formed on the substrate W.

At this time, the rotation speed of the substrate W is accelerated up to 1000 rpm, and the IPA is continuously supplied onto the substrate W for a predetermined period with the rotation speed kept at this level. Thus, the deionized water remaining on the upper surface of the substrate W is replaced with the IPA. Thereafter, the control section 11 closes the treatment liquid valve 22 to stop spouting the IPA from the treatment liquid nozzle 21. During the IPA replacement operation, the gas ejection nozzle 6 is not moved toward the substrate W but located above the substrate W, so that the lower end of the gas ejection nozzle 6 is substantially prevented from being immersed in the IPA film.

In turn, a covering operation is performed to form the nitrogen gas-flow and cover the upper surface of the substrate W with the nitrogen gas-flow (Step S5). More specifically, the control section 11 controls the motor 10 to increase the rotation speed of the substrate W so as to reduce the thickness of the IPA film retained on the substrate W. Thus, the IPA on the substrate W is spun off, so that the amount of the IPA on the substrate is reduced. Therefore, the thickness of the IPA film retained on the substrate W is reduced.

Subsequently, the control section 11 controls the nozzle lift mechanism 25 to move the gas ejection nozzle 6 from the upper position to the adjacent position (indicated in FIG. 5). Thus, the lower surface of the gas ejection nozzle 6 is opposed to the center portion of the upper surface of the substrate W in adjacent relation to the substrate W. At this time, the IPA film on the substrate W has a reduced thickness, so that the lower end of the gas ejection nozzle 6 can be opposed to the center portion of the upper surface of the substrate W without being immersed in the IPA film.

In turn, the control section 11 opens the first gas valve 17 to eject the nitrogen gas radially from the gas ejection port 55 located above the center portion of the substrate W toward the peripheral portion of the upper surface of the substrate W held by the spin chuck 3. The ejection of the nitrogen gas from the gas ejection port 55 may be started either before or after the gas ejection nozzle 6 is moved from the upper position to the adjacent position.

With the nitrogen gas being ejected radially from the gas ejection port 55, as described above, the nitrogen gas-flow is formed as having a conical shape expanding downward from the gas ejection nozzle 6. Thus, the entire upper surface of the substrate W is covered with the gas ejection nozzle 6 and the nitrogen gas-flow (covering operation). Further, a space defined between the substrate W and the gas ejection nozzle 6 is enclosed by the nitrogen gas-flow to be thereby isolated from the ambient space.

Subsequently, a purging operation is performed to expel air from the space defined on the substrate W to replace an atmosphere on the substrate W with a nitrogen gas atmosphere (Step S6). More specifically, the control section 11 opens the second gas valve 19 with the nitrogen gas being ejected from the gas ejection port 55, whereby the nitrogen gas is ejected downward from the lower surface ejection port 54 located above the center portion of the substrate W as shown in FIG. 5.

The nitrogen gas ejected from the lower surface ejection port 54 is supplied to the space between the substrate W and the gas ejection nozzle 6, and forced to flow outward by the subsequently supplied nitrogen gas. Therefore, air present in the space between the substrate W and the gas ejection nozzle 6 is forced to flow outward by the nitrogen gas ejected from the lower surface ejection port 54. Then, the pressure of the nitrogen gas ejected from the lower surface ejection port 54 causes the air to pass through the nitrogen gas-flow to be expelled from the space between the substrate W and the gas ejection nozzle 6. Thus, the air is expelled from the space defined on the substrate W, and the atmosphere on the substrate W is replaced with the nitrogen gas atmosphere (purging operation).

As described above, the nitrogen gas ejected from the lower surface ejection port 54 has a pressure reduced in the gas ejection nozzle 6. Therefore, even if the nitrogen gas is applied to the upper surface of the substrate W from the lower surface ejection port 54, the IPA film is unlikely to be partly removed from the substrate W to partly expose the upper surface of the substrate W. This eliminates the possibility that the quality of the substrate W is reduced due to partial drying of the upper surface of the substrate W.

In turn, a drying operation (spin-drying operation) is performed to dry the substrate W (Step S7). More specifically, the control section 11 controls the motor 10 to rotate the substrate W at a higher rotation speed (e.g., several thousands rpm). Thus, a greater centrifugal force acts on the IPA present on the substrate W to move the IPA outward. Then, the IPA passes through the nitrogen gas-flow to be spun off around the substrate W. Thus, the IPA is removed from the substrate W to dry the substrate W. After the high speed rotation of the substrate W is continued for a predetermined period, the rotation of the motor 10 is stopped to cause the spin chuck 3 to stop the rotation of the substrate W. Further, the ejection of the nitrogen gas from the lower surface ejection port 54 and the gas ejection port 55 is stopped, and then the gas ejection nozzle 6 is retracted to the lateral side of the spin chuck 3. Thereafter, the treated substrate W is transported out of the treatment chamber 2 by the transport robot.

During the drying operation, the substrate W is thus covered with the gas ejection nozzle 6 and the nitrogen gas-flow from the above, whereby the upper surface of the substrate W is protected from the foreign matter such as particles and the mist of the treatment liquid to suppress or prevent the adhesion of the foreign matter and the mist on the upper surface of the substrate W. This suppresses or prevents the contamination of the substrate W with the foreign matter such as particles and the mist of the treatment liquid. Further, the substrate W is dried with the atmosphere on the substrate W kept in the nitrogen gas atmosphere, whereby the substrate W is substantially free from formation of water marks and other drying failures. Further, the substrate W is dried after the deionized water on the substrate W is replaced with the IPA. Therefore, the substrate can be quickly dried as compared with a case in which the drying is achieved without the replacement.

In this embodiment, as described above, the nitrogen gas is ejected radially from the gas ejection port 55 with the gas ejection nozzle 6 being located above the center portion of the substrate W, whereby the nitrogen gas-flow is formed as spreading from the gas ejection nozzle 6. Then, the entire upper surface of the substrate W is covered with this nitrogen gas-flow and the gas ejection nozzle 6 to be thereby protected from the foreign matter such as particles and the mist of the treatment liquid. This suppresses or prevents the contamination of the substrate W which may otherwise occur due to the adhesion of the foreign matter such as particles and the mist of the treatment liquid to the substrate W.

Since the gas ejection nozzle 6 is a relatively small component having a smaller diameter than the substrate W held by the spin chuck 3, the size increase of the treatment unit 1 is suppressed. In this embodiment, particularly, the plurality of treatment units 1 are provided in the substrate treatment apparatus, so that the size increase of the overall substrate treatment apparatus is significantly suppressed by suppressing the size increase of the respective treatment units 1.

More specifically, even if the treatment units 1 are disposed at different positions in horizontally spaced relation as in this embodiment, an increase in the footprint of the substrate treatment apparatus (an area occupied by the substrate treatment apparatus) can be significantly suppressed by suppressing the size increase of the respective treatment units 1. Further, where the treatment units 1 are disposed in vertically stacked relation as in this embodiment, an increase in the height of the substrate treatment apparatus can be significantly suppressed by suppressing the size increase of the respective treatment units 1.

Since the gas ejection nozzle 6 is adapted to be retracted to the lateral side of the spin chuck 3, there is no need to provide a space above the spin chuck 3 for retracting the gas ejection nozzle 6. This further suppresses the increase in the height of each of the treatment units 1. Therefore, the increase in the height of the substrate treatment apparatus can be significantly suppressed.

Figure 9:
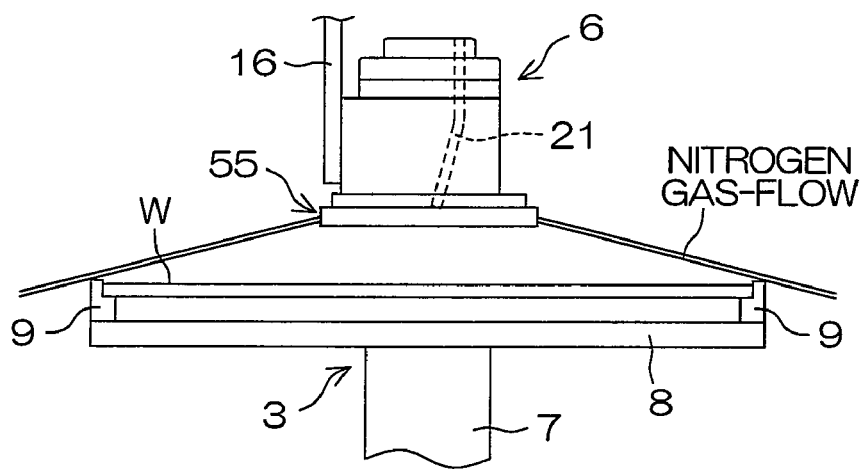
FIG. 9 is a schematic side view of the spin chuck and the gas ejection nozzle for explaining another exemplary nitrogen gas ejection state observed when the nitrogen gas is ejected from the gas ejection port.

While the first embodiment has thus been described, it should be understood that the present invention be not limited to the first embodiment, but various modifications may be made within the scope of the appended claims. In the first embodiment, the nitrogen gas is ejected radially from the gas ejection port 55 obliquely downward toward the peripheral portion of the upper surface of the substrate W held by the spin chuck 3 by way of example, but not by way of limitation. More specifically, as shown in FIG. 9, the nitrogen gas may be ejected radially from the gas ejection port 55 obliquely downward toward a perimeter defined by the holder members 9.

Figure 10:
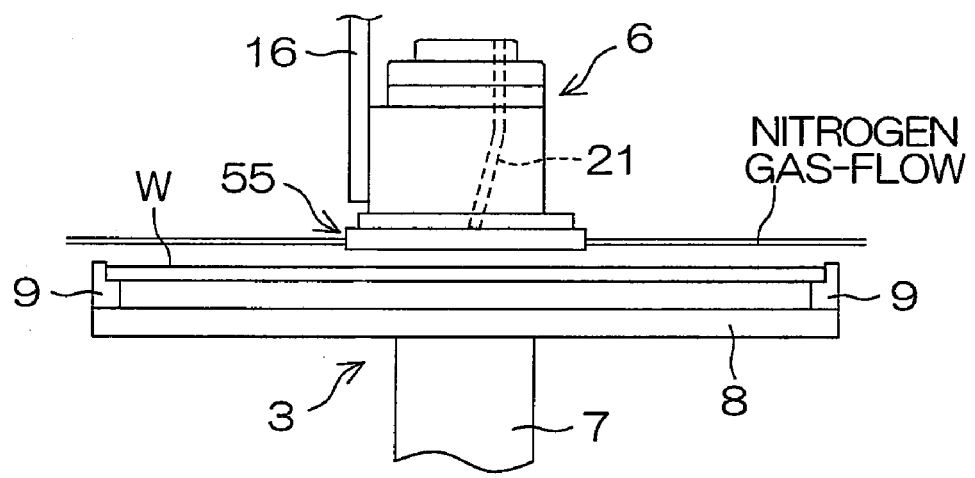
FIG. 10 is a schematic side view of the spin chuck and the gas ejection nozzle for explaining further another exemplary nitrogen gas ejection state observed when the nitrogen gas is ejected from the gas ejection port.

Further, as shown in FIG. 10, the nitrogen gas may be ejected horizontally and radially from the gas ejection port 55.

Where the nitrogen gas is ejected from the gas ejection port 55 toward the perimeter defined by the holder members 9, the nitrogen gas-flow can be formed as having a conical shape expanding from the gas ejection nozzle 6, and the substrate W held by the spin chuck 3 and the plurality of holder members 9 can be located in a space enclosed by this nitrogen gas-flow. Therefore, the space between the substrate W and the gas ejection nozzle 6 and a space around the holder members 9 are isolated from the ambient space by the nitrogen gas-flow, so that these spaces can be kept clean. When the substrate W held by the spin chuck 3 is rotated, the gas-flow is likely to be made turbulent around the holder members 9 by the rotation of the holder members 9 to cause the atmosphere around the holder members 9 to intrude into the space adjacent to the substrate W. Even in this case, the substrate W, which is possibly exposed to the intruding atmosphere, is substantially free from contamination, because the intruding atmosphere is clean. Further, not only the upper surface but also the lower surface and the peripheral surface of the substrate W are protected by the nitrogen gas-flow. This suppresses or prevents the contamination of the entire substrate W.

Figure 11:
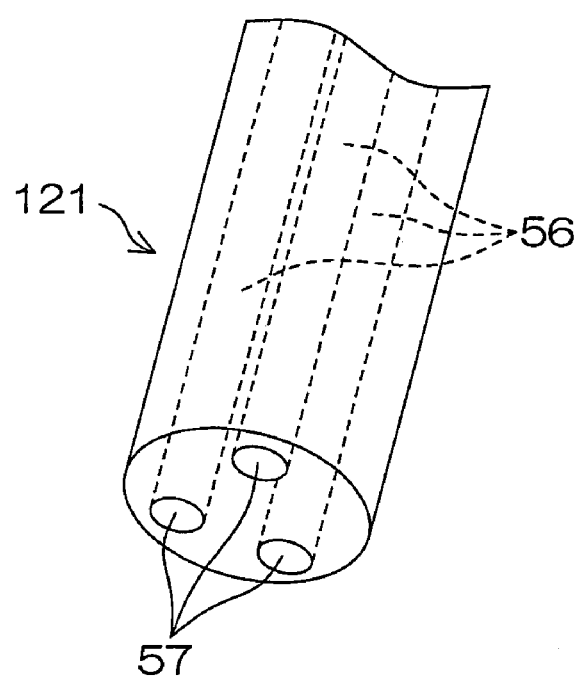
FIG. 11 is a schematic external view of a treatment liquid nozzle according to another embodiment of the present invention.

In the first embodiment, the treatment liquid nozzle 21 has a single flow passage, and a single type of treatment liquid (IPA) is spouted from the treatment liquid nozzle 21 by way of example, but not by way of limitation. For example, as shown in FIG. 11, a nozzle 121 having a plurality of flow passages therein may be employed as the treatment liquid nozzle. The treatment liquid nozzle 121 shown in FIG. 11 has three separate flow passages 56 each extending longitudinally therein, and is capable of spouting treatment liquids respectively supplied into the three flow passages 56 from three treatment liquid ejection ports 57 provided in one end of the treatment liquid nozzle 121. Therefore, where different types of treatment liquids are respectively supplied into the three flow passages 56, the different types of treatment liquids can be spouted from the treatment liquid nozzle 121. Further, where a gas is supplied into any one of the flow passages 56, not only the treatment liquids but also the gas can be ejected from the treatment liquid nozzle 121. Therefore, the gas ejection nozzle 6 according to the first embodiment may be modified so as to eject the nitrogen gas from any one of the flow passages 56 and spout the IPA from another of the flow passages 56 by inserting the treatment liquid nozzle 121 into the cylindrical column member 36 rather than providing the center through-hole 44 and the treatment liquid nozzle 21. Further, the gas ejection nozzle 6 may be configured so as to spout the deionized water from the other flow passage 56 to perform the rinsing operation. In this case, the rinse liquid nozzle 5 may be obviated.

In the first embodiment, the gas ejection nozzle 6 is used in a process in which the rinsing operation, the IPA replacement operation and the spin-drying operation are performed in this order, but may be used in any other process. In a process in which the spin-drying operation is performed without performing the IPA replacement operation after the rinsing operation, for example, the nitrogen gas may be ejected from the gas ejection nozzle 6 during the spin-drying operation.

In the first embodiment, the substrate W is a round substrate by way of example, but is not limited to the round substrate. For example, the substrate W may be a polygonal substrate such as a rectangular substrate.

Next, a second embodiment of the present invention will be described in detail with reference to the attached drawings.

Figure 12:
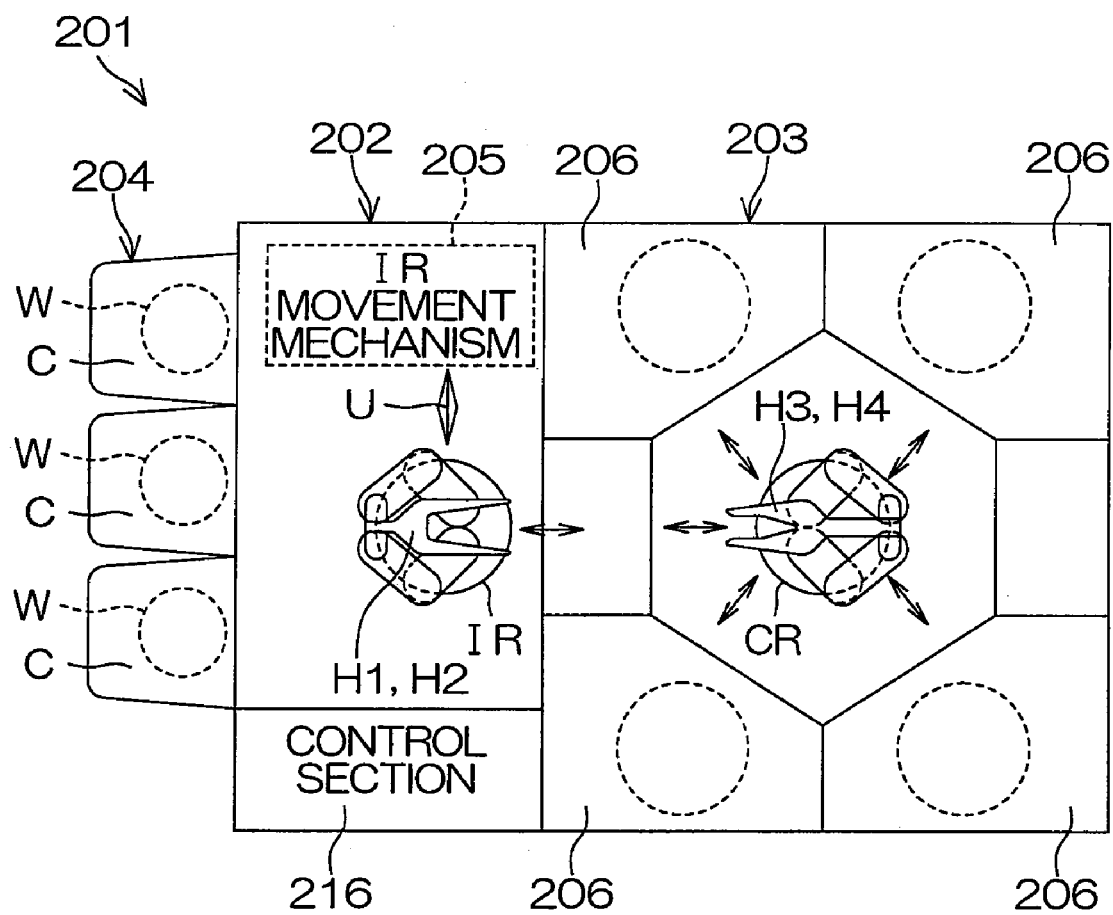
FIG. 12 is a schematic plan view showing a layout in a substrate treatment apparatus according to a second embodiment of the present invention.

FIG. 12 is a schematic plan view showing a layout in a substrate treatment apparatus 201 according to the second embodiment of the present invention.

The substrate treatment apparatus 201 is of a single substrate treatment type which is adapted to treat a single substrate W (a semiconductor wafer or the like) at a time. The substrate treatment apparatus 201 includes an indexer block 202, and a treatment block 203 connected to the indexer block 202.

The indexer block 202 includes a carrier retaining portion 204, an indexer robot IR, and an indexer robot movement mechanism 205 (hereinafter referred to as "IR movement mechanism 205"). The carrier retaining portion 204 retains carriers C each accommodating a plurality of substrates W. The carriers C are retained by the carrier retaining portion 204 as being aligned in a predetermined alignment direction U (hereinafter referred to as "carrier alignment direction U"). The IR movement mechanism 205 is capable of horizontally moving the indexer robot IR along the carrier alignment direction U.

The indexer robot IR includes a first upper hand H1 attached to a distal end of a first upper arm, and a first lower hand H2 attached to a distal end of a first lower arm. The first upper hand H1 and the first lower hand H2 are disposed at different height positions in a vertically offset manner so as not to interfere with each other. In FIG. 12, the first upper hand H1 and the first lower hand H2 are illustrated as vertically overlapping each other. The indexer robot IR holds the substrate W by means of its hands H1, H2. The indexer robot IR is brought into opposed relation to any one of the carriers C to perform a loading operation for loading a treated substrate W into the carrier C and an unloading operation for unloading an untreated substrate W from the carrier C.

On the other hand, the treatment block 203 includes a plurality of treatment units 206 which are each capable of treating a single substrate W at a time, and a center robot CR. In this embodiment, eight treatment units 206, for example, are provided, each two of which are vertically stacked. These treatment units 206 are disposed around the center robot CR as seen in plan (in FIG. 12, only four upper treatment units 206 are shown). The treatment units 206 each perform a cleaning operation, an etching operation, and a separating operation or the like on the single substrate W.

The center robot CR includes a second upper hand H3 attached to a distal end of a second upper arm, and a second lower hand H4 attached to a distal end of a second lower arm. The second upper hand H3 and the second lower hand H4 are disposed at different height positions in a vertically offset manner so as not to interfere with each other. In FIG. 12, the second upper hand H3 and the second lower hand H4 are illustrated as vertically overlapping each other. The center robot CR holds the substrate W by means of its hands H3, H4. The center robot CR is capable of performing a loading operation for loading an untreated substrate W into any one of the treatment units 206, and performing an unloading operation for unloading a treated substrate W from any one of the treatment units 206. Further, the center robot CR is capable of receiving an untreated substrate W from the indexer robot IR, and transferring a treated substrate W to the indexer robot IR.

An untreated substrate W accommodated in any one of the carriers C is unloaded from the carrier C by the indexer robot IR. Then, the untreated substrate W is transferred from the indexer robot IR to the center robot CR, and loaded into any one of the treatment units 206 by the center robot CR. Substrates W transferred to the center robot CR from the indexer robot IR are sequentially loaded into the respective treatment units 206 by the center robot CR.

On the other hand, the substrate W treated in the treatment unit 206 is unloaded from the treatment unit 206 by the center robot CR, and then transferred from the center robot CR to the indexer robot IR to be loaded into the carrier C by the indexer robot IR. The center robot CR sequentially unloads the treated substrates W from the respective treatment units 206. In this manner, the substrates W are treated.

Figure 13:
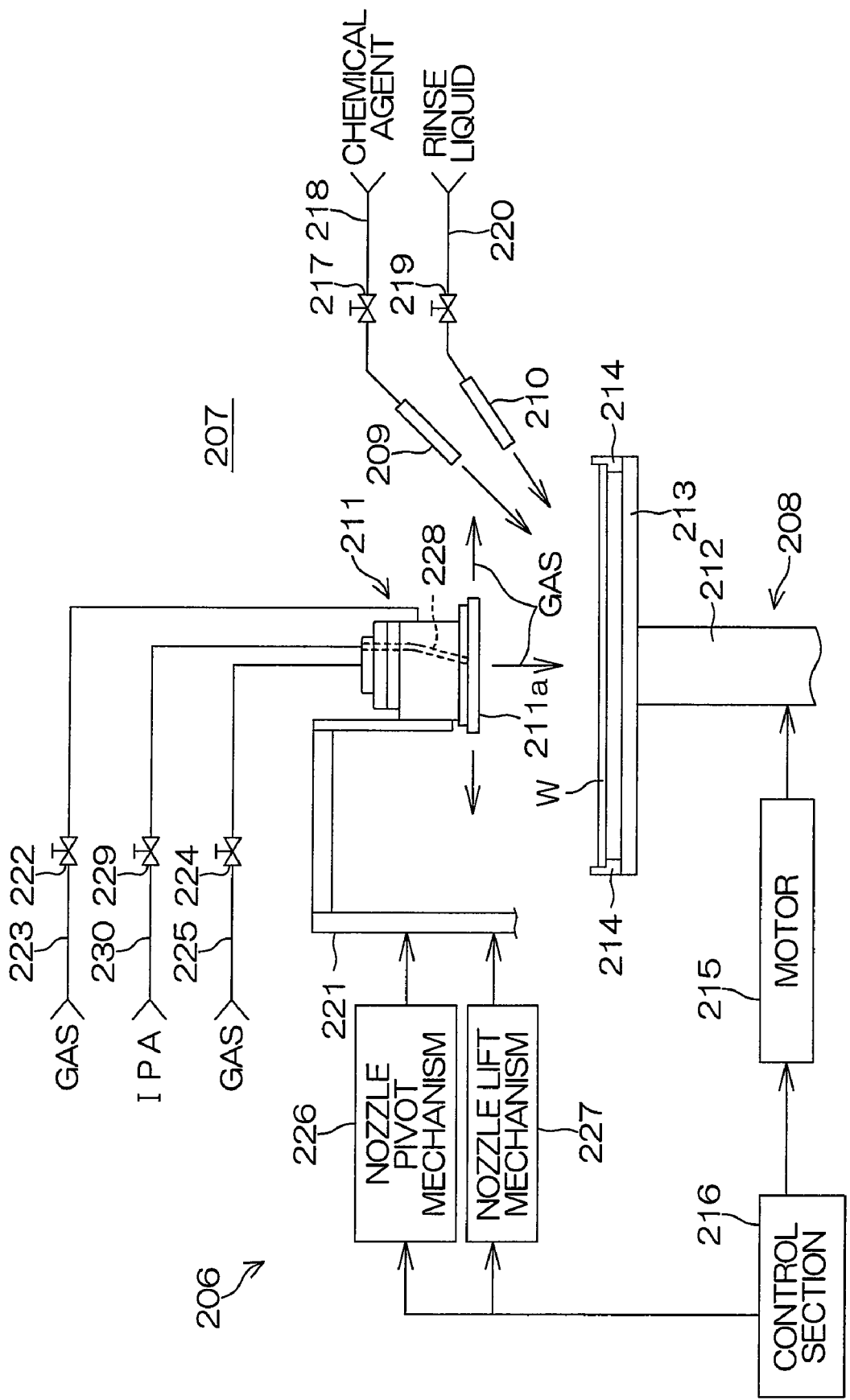
FIG. 13 is a schematic diagram showing the schematic construction of each treatment unit provided in the substrate treatment apparatus according to the second embodiment of the present invention.

FIG. 13 is a schematic diagram showing the schematic construction of each of the treatment units 206 provided in the substrate treatment apparatus 201 according to the second embodiment of the present invention.

The treatment units 206 each include a spin chuck 208 (substrate holding unit) which horizontally holds and rotates a single substrate W, a chemical agent nozzle 209 and a rinse liquid nozzle 210 which each supply a treatment liquid onto an upper surface of the substrate W held by the spin chuck 208, and a gas ejection nozzle 211 which ejects a gas onto the substrate W. The spin chuck 208, the chemical agent nozzle 209, the rinse liquid nozzle 210 and the gas ejection nozzle 211 are provided in a treatment chamber 207 defined by a partition wall not shown. Though not shown, the treatment units 206 each further include an FFU (fan filter unit) for taking clean air into the treatment chamber 207 from a clean room in which the substrate treatment apparatus 201 is installed after further cleaning the clean air. Down-flow is formed in the treatment chamber 207 by the clean air supplied from the FFU.

The spin chuck 208 includes a vertically extending rotation shaft 212, a disk-shaped spin base 213 horizontally attached to an upper end of the rotation shaft 212, a plurality of holder members 214 provided on the spin base 213, and a motor 215 connected to the rotation shaft 212. The holder members 214 are provided on a peripheral portion of an upper surface of the spin base 213 in circumferentially properly spaced relation so as to be disposed in association with an outer peripheral shape of the substrate W. The spin chuck 208 horizontally holds the substrate W above the spin base 208 with its holder members 214 holding the substrate W in abutment against a peripheral surface of the substrate W. By inputting a driving force of the motor 215 to the rotation shaft 212 with the substrate W thus held by the holder members 214, the substrate W is rotated about a vertical axis extending through the center of the substrate W. The motor 215 is controlled by a control section 216.

The construction of the spin chuck 208 is not limited to the aforementioned one, but may be of a vacuum suction type (vacuum chuck) which is adapted to horizontally hold the substrate W by vacuum suction of a lower surface (rear surface) of the substrate W and be rotated about the vertical axis in this state to rotate the thus held substrate W.

The chemical agent nozzle 209 is disposed at a higher position than the spin chuck 208 with its spout directing downward. A chemical agent is supplied into the chemical agent nozzle 209 from a chemical agent supply source not shown through a chemical agent supply pipe 218 provided with a chemical agent valve 217. The chemical agent supplied into the chemical agent nozzle 209 from the chemical agent supply source is spouted toward a center portion of the upper surface of the substrate W held by the spin chuck 208. Examples of the chemical agent to be supplied into the chemical agent nozzle 209 include solutions containing at least one of sulfuric acid, acetic acid, nitric acid, hydrochloric acid, hydrofluoric acid, ammonia water, hydrogen peroxide water, organic acids such as citric acid and oxalic acid, organic alkalis such as TMAH (tetramethylammonium hydroxide), surface active agents and corrosion inhibitors.

The rinse liquid nozzle 210 is disposed at a higher position than the spin chuck 208 with its spout directing downward. A rinse liquid is supplied into the rinse liquid nozzle 210 from a rinse liquid supply source not shown through a rinse liquid supply pipe 220 provided with a rinse liquid valve 219. The rinse liquid supplied into the rinse liquid nozzle 210 from the rinse liquid supply source is spouted onto the center portion of the upper surface of the substrate W held by the spin chuck 208. Examples of the rinse liquid to be supplied into the rinse liquid nozzle 210 include deionized water, carbonated water, electrolytic ion water, hydrogen water, ozone water and hydrochloric acid aqueous solutions having very low concentrations (e.g., about 10 to about 100 ppm).

The gas ejection nozzle 211 is a cylindrical member having a smaller diameter than the substrate W held by the spin chuck 208. The gas ejection nozzle 211 is vertically supported above the spin chuck 208 by a support arm 221. A first gas supply pipe 223 (gas supply unit) provided with a first gas valve 222 and a second gas supply pipe 225 (gas supply unit) provided with a second gas valve 224 are connected to the gas ejection nozzle 211. A gas is supplied into the gas ejection nozzle 211 from a gas supply source not shown through the first gas supply pipe 223 and the second gas supply pipe 225. As will be described later, the gas ejection nozzle 211 is capable of ejecting the gas horizontally and downward above the spin chuck 208. Examples of the gas to be supplied into the gas ejection nozzle 211 include inert gases such as nitrogen gas, dry air and clean air.

The support arm 221 is pivotal about a vertical pivot axis provided on a lateral side of the spin chuck 208. A nozzle pivot mechanism 226 pivots the support arm 221 about the pivot axis. With the support arm 221 being pivoted by the nozzle pivot mechanism 226, the gas ejection nozzle 211 is horizontally moved. This makes it possible to locate the gas ejection nozzle 211 above the substrate W held by the spin chuck 208 or retract the gas ejection nozzle 211 from above the spin chuck 208. The pivot axis of the support arm 221 is defined so that the gas ejection nozzle 211 can be horizontally moved along a predetermined path extending through above the center portion of the substrate W held by the spin chuck 208.

Figure 16:
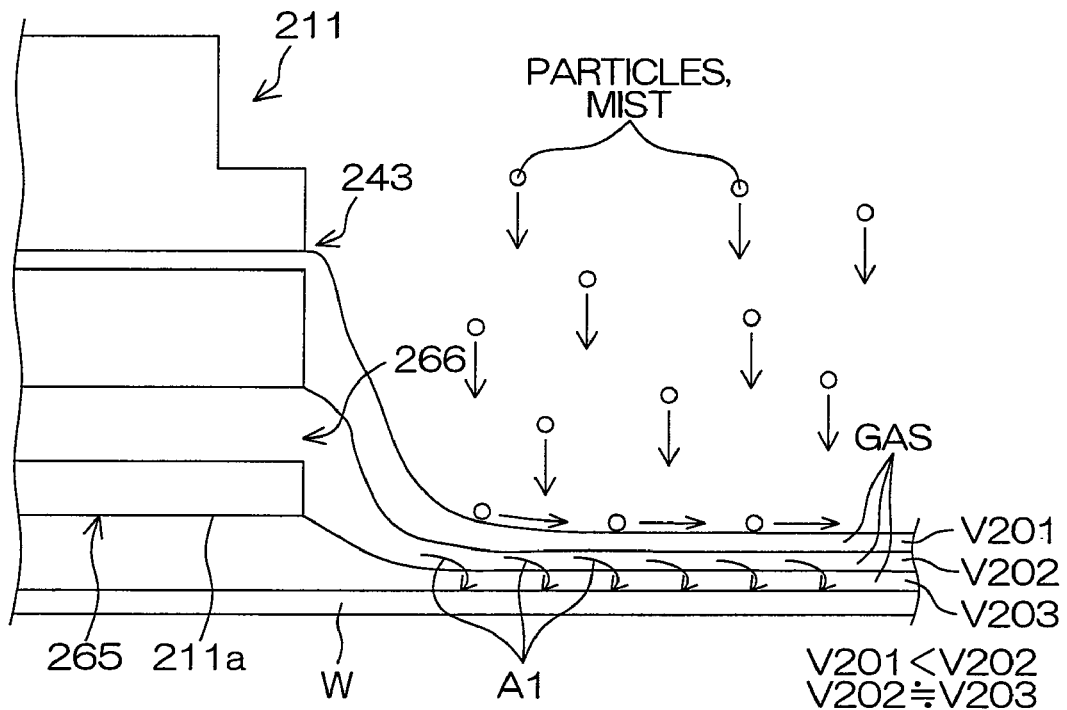
FIG. 16 is a schematic side view of the gas ejection nozzle and a substrate for explaining a gas ejection state observed when a gas is ejected from three gas ejection ports with the gas ejection nozzle located adjacent a center portion of an upper surface of a substrate according to the second embodiment of the present invention.

Further, a nozzle lift mechanism 227 is connected to the support arm 221 to vertically move up and down the support arm 221. The nozzle lift mechanism 227 vertically moves up and down the gas ejection nozzle 211 by vertically moving up and down the support arm 221. With the gas ejection nozzle 211 being located above the center portion of the substrate W held by the spin chuck 208, the support arm 221 is moved up and down by the nozzle lift mechanism 227, whereby the gas ejection nozzle 211 is moved toward the center portion of the upper surface of the substrate W and moved upward away from the substrate W. The nozzle lift mechanism 227 is capable of moving up and down the gas ejection nozzle 211 between an adjacent position (as shown in FIG. 16) at which the gas ejection nozzle 211 is located adjacent the center portion of the upper surface of the substrate W and an upper position (as shown in FIG. 13) that is higher than the adjacent position. The nozzle pivot mechanism 226 and the nozzle lift mechanism 227 are each controlled by the control section 216.

A treatment liquid nozzle 228 which spouts a treatment liquid is attached to the gas ejection nozzle 211. The treatment liquid nozzle 228 is partly disposed in the gas ejection nozzle 211. The treatment liquid nozzle 228 is capable of spouting the treatment liquid downward from the center portion of a lower surface 211a of the gas ejection nozzle 211. A treatment liquid supply pipe 230 provided with a treatment liquid valve 229 is connected to the treatment liquid nozzle 228. The treatment liquid is supplied into the treatment liquid nozzle 228 from a treatment liquid supply source not shown through the treatment liquid supply pipe 230.

An example of the treatment liquid to be supplied into the treatment liquid nozzle 228 is IPA (isopropyl alcohol). The IPA is an exemplary organic solvent which is more volatile than the deionized water, and the deionized water is highly soluble in the IPA. Other examples of the treatment liquid more volatile than the deionized water include liquids containing at least one of HFE (hydrofluoroether), methanol, ethanol, acetone and trans-1,2-dichloroethylene. These organic solvents may be used either alone or in combination with other component. For example, a liquid mixture of the IPA and the deionized water or a liquid mixture of the IPA and the HFE may be used as the treatment liquid.

Figure 14:
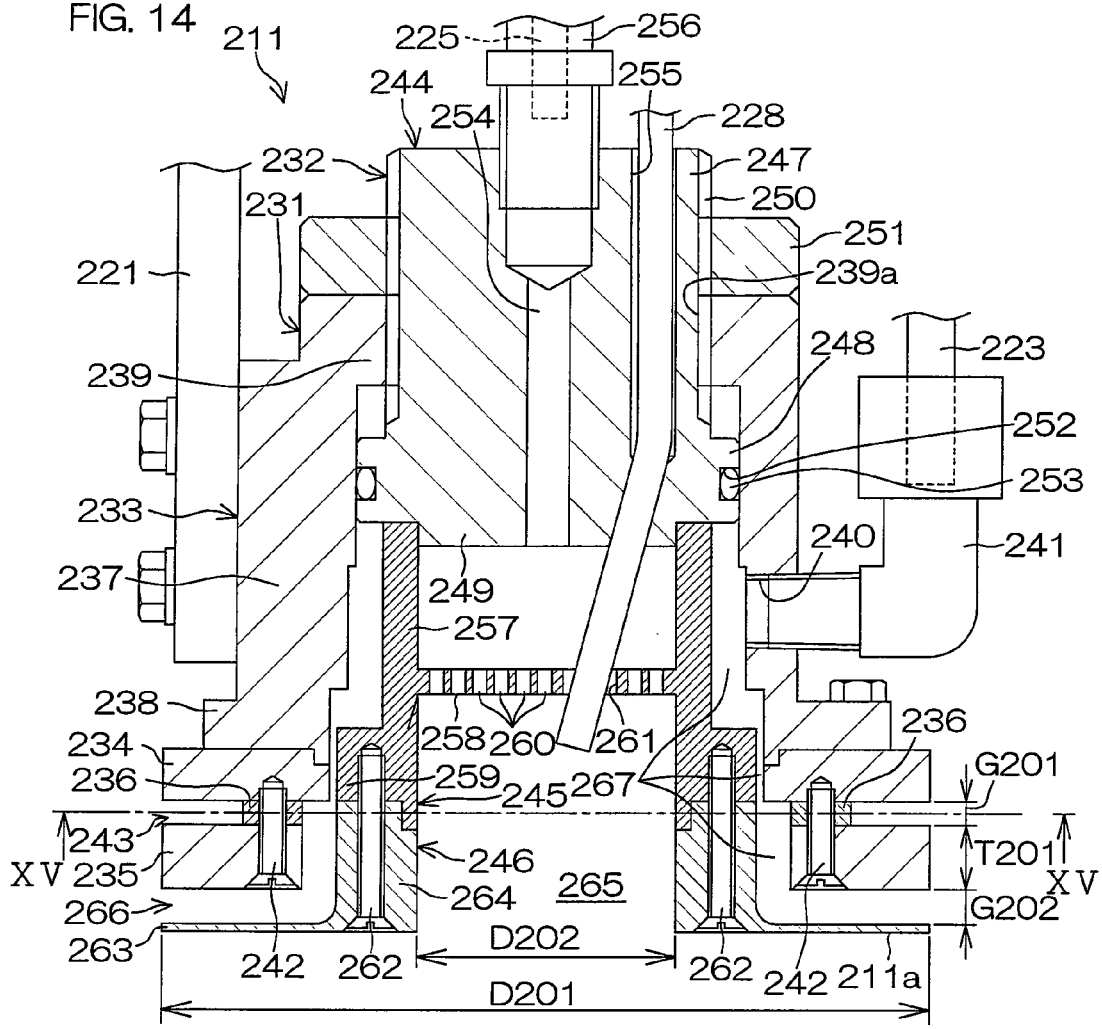
FIG. 14 is a schematic vertical sectional view of a gas ejection nozzle according to the second embodiment of the present invention.
Figure 15:
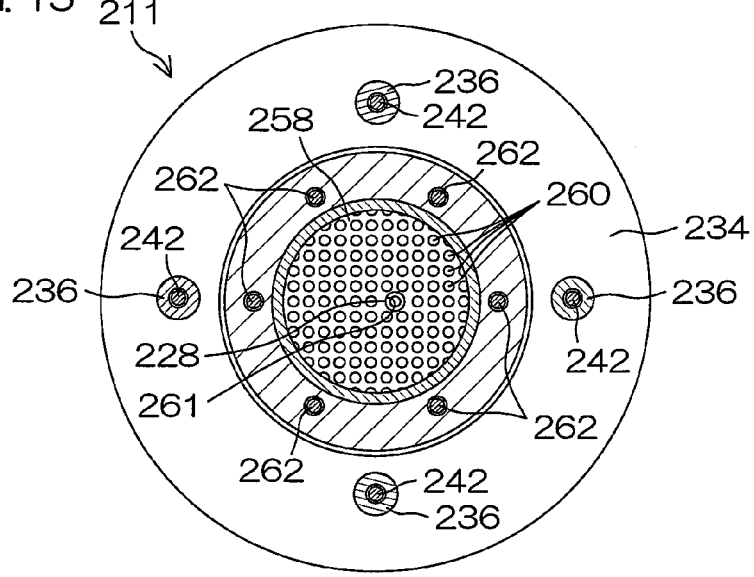
FIG. 15 is a schematic sectional view of the gas ejection nozzle taken along a line XV-XV in FIG. 14.

FIG. 14 is a schematic vertical sectional view of the gas ejection nozzle 211, and FIG. 15 is a schematic sectional view of the gas ejection nozzle 211 taken along a line XV-XV in FIG. 14. The structure of the gas ejection nozzle 211 will hereinafter be described more specifically with reference to FIGS. 14 and 15.

The gas ejection nozzle 211 includes an outer structural member 231 defining an exterior of the gas ejection nozzle 211, and an inner structural member 232 defining an interior of the gas ejection nozzle 211. The outer structural member 231 is tubular, and the inner structural member 232 is fitted in the outer structural member 231. The outer structural member 231 is supported by the support arm 221. The inner structural member 232 is supported by the support arm 221 via the outer structural member 231.

The outer structural member 231 includes a housing 233, an upper plate 234 and an intermediate plate 235. The housing 233 has a cup shape having an opening on its lower side, and is disposed in a vertical attitude. The upper plate 234 has an annular shape as seen in plan, and is connected in a horizontal attitude to a lower edge of the housing 233. The intermediate plate 235 has an annular shape as seen in plan, and is connected in a horizontal attitude to the upper plate 234 via a plurality of shims 236. The housing 233, the upper plate 234 and the intermediate plate 235 are connected to each other coaxially with each other.

The housing 233 includes a hollow cylindrical peripheral wall portion 237, an annular flange portion 238 extending outward from one end portion (a lower end portion in FIG. 14) of the peripheral wall portion 237, and an inward extension portion 239 extending inward from the other end portion (an upper end portion in FIG. 14) of the peripheral wall portion 237. The inward extension portion 239 has a female thread hole 239a provided in a center portion thereof. The peripheral wall portion 237 has a cylindrical inner peripheral surface extending stepwise with its inner diameter changing stepwise. The inner diameter of the peripheral wall portion 237 is increased stepwise toward its lower side. The peripheral wall portion 237 has a joint connection hole 240 extending radially therethrough. The first gas supply pipe 223 is connected to the joint connection hole 240 via a first joint 241. The gas flowing through the first gas supply pipe 223 is supplied into an inside space of the peripheral wall portion 237 through the first joint 241.

The upper plate 234 is connected in the horizontal attitude to the flange portion 238 coaxially with the peripheral wall portion 237. The upper plate 234 has an inner diameter that is equal to the inner diameter of the lower end portion of the peripheral wall portion 237. The upper plate 234 has an inner peripheral surface entirely continuous to the inner peripheral surface of the lower end portion of the peripheral wall portion 237. The upper plate 234 has a flat lower surface extending along a horizontal plane.

The intermediate plate 235 is horizontally disposed below the upper plate 234 coaxially with the peripheral wall portion 237. The intermediate plate 235 is connected to the upper plate 234 by a plurality of flat head screws 242 extending through the intermediate plate 235 and the respective shims 236. The intermediate plate 235 has an inner diameter that is greater than the inner diameter of the upper plate 234, and an outer diameter that is equal to an outer diameter of the upper plate 234. The intermediate plate 235 has upper and lower surfaces that are flat and extend horizontally.

The shims 236 have an even height, and are arranged equidistantly circumferentially of the intermediate plate 235. The upper surface of the intermediate plate 235 is vertically spaced from the lower surface of the upper plate 234 in parallel opposed relation. An annular space is defined between the upper surface of the intermediate plate 235 and the lower surface of the upper plate 234 as extending horizontally. An annular upper gas ejection port 243 (first gas ejection port) is defined between an outer peripheral surface of the intermediate plate 235 and an outer peripheral surface of the upper plate 234 as surrounding the gas ejection nozzle 211.

The inner structural member 232 includes a cylindrical column member 244, a tubular member 245 and a plate member 246. The cylindrical column member 244 is connected in a vertical attitude to the outer structural member 231. The tubular member 245 is connected in a vertical attitude to a lower end of the cylindrical column member 244. The plate member 246 is connected in a horizontal attitude to a lower end of the tubular member 245. The cylindrical column member 244, the tubular member 245 and the plate member 246 are connected to each other coaxially with each other.

The cylindrical column member 244 includes a cylindrical thread portion 247, a cylindrical overhang portion 248, and a cylindrical projection 249. The thread portion 247, the overhang portion 248 and the projection 249 are disposed coaxially with each other. The overhang portion 248 is provided below the thread portion 247, and has an outer peripheral surface projecting outward of the thread portion 247. The projection 249 projects downward from a lower surface of the overhang portion 248, and has an outer diameter that is smaller than an outer diameter of the overhang portion 248.

The thread portion 247 has an outer peripheral surface formed with a male thread 250 coupled with the female thread hole 239a. The thread portion 247 is fitted in the female thread hole 239a from the below. The thread portion 247 has an upper end portion projecting upward of the inward extension portion 239, and a lock nut 251 is fitted around the projecting portion (the upper end portion of the thread portion 247). Thus, the inner structural member 232 is firmly connected to the outer structural member 231.

The overhang portion 248 has an annular groove 252 formed circumferentially in the outer peripheral surface thereof. An O-ring 253 is accommodated in the annular groove 252. The overhang portion 248 is located inward of the upper end portion of the peripheral wall portion 237. The outer diameter of the overhang portion 248 is slightly smaller than the inner diameter of the upper end portion of the peripheral wall portion 237. A gap between the overhang portion 248 and the peripheral wall portion 237 is sealed with the O-ring 253.

The cylindrical column member 244 has a center through-hole 254 and a nozzle retention hole 255 each extending axially thereof. The center through-hole 254 extends along a center axis of the cylindrical column member 244, and the second gas supply pipe 225 is connected to an upper end of the center through-hole 254 via a second joint 256. The gas flowing through the second gas supply pipe 225 is supplied into the center through-hole 254 through the second joint 256. Further, the gas supplied into the center through-hole 254 is ejected downward from a lower end of the center through-hole 254 located in a center portion of a lower surface of the cylindrical column member 244.

A portion of the nozzle retention hole 255 from an upper end to a lower end portion extends axially of the cylindrical column member 244. A lower end portion of the nozzle retention hole 255 is inclined downward toward the center axis of the cylindrical column member 244. The treatment liquid nozzle 228 is inserted in the nozzle retention hole 255 from the above. A lower end portion of the treatment liquid nozzle 228 is inclined downward toward the center axis of the cylindrical column member 244 along the lower end portion of the nozzle retention hole 255. A lower end of the treatment liquid nozzle 228 is located below the cylindrical column member 244.

The tubular member 245 is connected in a vertical attitude to the lower end of the cylindrical column member 244. The tubular member 245 has a cylindrical inner peripheral surface having a constant diameter. The inner diameter of the tubular member 245 is sufficiently greater than an inner diameter of the center through-hole 254. The tubular member 245 has a cylindrical outer peripheral surface extending stepwise with its outer diameter changing stepwise. A portion of the tubular member 245 from an upper end to a lower end portion has a constant outer diameter (equivalent to the outer diameter of a hollow cylindrical portion 257 to be described later). A lower end portion of the tubular member 245 has a constant outer diameter (equivalent to the outer diameter of a connection portion 259 to be described later) which is greater than the outer diameter of the upper portion of the tubular member 245.

The tubular member 245 includes a hollow cylindrical portion 257, a disk-shaped partition portion 258, and a hollow cylindrical connection portion 259. The hollow cylindrical portion 257, the connection portion 259 and the partition portion 258 are disposed coaxially with each other. The hollow cylindrical portion 257 has an upper edge fitted around the projection 249. Further, the partition portion 258 is disposed in a horizontal attitude in an inside space of the hollow cylindrical portion 257. The inside space of the hollow cylindrical portion 257 is vertically partitioned by the partition portion 258. The connection portion 259 is connected to a lower edge of the hollow cylindrical portion 257, and has a greater outer diameter than the hollow cylindrical portion 257.

The partition portion 258 has a plurality of gas flow holes 260, and a nozzle insertion hole 261. The gas flow holes 260 are provided in the entire partition portion 258 as extending thicknesswise through the partition portion 258. The nozzle insertion hole 261 is disposed adjacent a center portion of the partition portion 258. The lower end portion of the treatment liquid nozzle 228 extends downward from an upper side through the nozzle insertion hole 261. The lower end of the treatment liquid nozzle 228 is disposed at a lower position than the partition portion 258 in an inside space of the tubular member 245. The IPA supplied into the treatment liquid nozzle 228 is spouted downward from the lower end of the treatment liquid nozzle 228.

As shown in FIG. 14, the tubular member 245 is disposed in an inside space of the outer structural member 231. A circular tubular space is defined between an outer peripheral surface of the hollow cylindrical portion 257 and an inner peripheral surface of the outer structural member 231. This circular tubular space communicates with the joint connection hole 240. Further, a circular tubular space is defined between an outer peripheral surface of the connection portion 259 and the inner peripheral surface of the outer structural member 231. This circular tubular space communicates with the space defined between the hollow cylindrical portion 257 and the outer structural member 231. A radial distance between the outer peripheral surface of the connection portion 259 and the inner peripheral surface of the outer structural member 231 is smaller than a radial distance between the outer peripheral surface of the hollow cylindrical portion 257 and the inner peripheral surface of the outer structural member 231.

The plate member 246 has an annular shape as seen in plan. The plate member 246 has an inner diameter that is equal to the inner diameter of the hollow cylindrical portion 245. The plate member 246 is coaxially connected to the connection portion 259 by a plurality of flat head screws 262 extending vertically through the plate member 246. The plate member 246 has an inner peripheral surface entirely continuous to the inner peripheral surface of the tubular member 245. The flat head screws 262 are fixed to the plate member 246 from the below. Lower ends of the respective flat head screws 262 (heads of the respective flat head screws 262) are accommodated inside the plate member 246.

The plate member 246 includes a lower plate 263 disposed in a horizontal attitude and having an annular shape as seen in plan, and a hollow cylindrical connection portion 264 extending upward from an inner peripheral portion of an upper surface of the lower plate 263. The lower plate 263 is disposed below the intermediate plate 235, and the connection portion 264 is partly disposed in the inside space of the outer structural member 231. The lower plate 263 and the connection portion 264 are coaxially connected to each other.

The lower plate 263 has an outer diameter that is equal to the outer diameters of the upper plate 234 and the intermediate plate 235. The lower plate 263 has upper and lower surfaces which are flat and extend horizontally. The lower surface of the lower plate 263 is equivalent to the lower surface 211a (oppose surface) of the gas ejection nozzle 211. The lower plate 263 has a center gas ejection port 265 (third gas ejection port) provided in the center portion of the lower surface thereof for ejecting the gas and having a round shape as seen in plan.

The upper surface of the lower plate 263 is vertically spaced from the lower surface of the intermediate plate 235 in parallel opposed relation. An annular space is defined between the upper surface of the lower plate 263 and the lower surface of the intermediate plate 235 as extending horizontally. A lower gas ejection port 266 (second gas ejection port) is defined between an outer peripheral surface of the lower plate 263 and the outer peripheral surface of the intermediate plate 235 as surrounding the gas ejection nozzle 211.

The connection portion 264 has an outer peripheral surface having a constant diameter. The outer diameter of the connection portion 264 is equal to the outer diameter of the connection portion 259. The connection portion 264 is coaxially connected to the connection portion 259. The outer peripheral surface of the connection portion 264 is entirely continuous to the outer peripheral surface of the connection portion 259.

A circular tubular space is defined between the outer peripheral surface of the connection portion 264 and the inner peripheral surface of the outer structural member 231. This circular tubular space communicates with the tubular space defined between the tubular member 245 and the outer structural member 231. The space defined between the connection portion 264 and the outer structural member 231 communicates with the annular space between the upper plate 234 and the intermediate plate 235, and the annular space between the intermediate plate 235 and the lower plate 263. These spaces collectively define a gas flow passage 267 through which the gas flows. That is, the gas supplied into the gas ejection nozzle 211 from the first gas ejection supply pipe 223 is ejected from the upper gas ejection port 243 and the lower gas ejection port 266 through these spaces.

More specifically, the gas supplied into the gas ejection nozzle 211 from the first gas supply pipe 223 is generally horizontally ejected from the joint connection hole 240 toward the inside space of the peripheral wall portion 237. The gas spouted from the joint connection hole 240 impinges on the outer peripheral surface of the hollow cylindrical portion 257 to spread in the space between the hollow cylindrical portion 257 and the outer structural member 231. The gas spreading in the space between the hollow cylindrical portion 257 and the outer structural member 231 flows down through the space between the connection portion 259 and the outer structural member 231 to be supplied into the annular space between the upper plate 234 and the intermediate plate 235 and into the annular space between the intermediate plate 235 and the lower plate 263. The gas supplied into the annular space between the upper plate 234 and the intermediate plate 235 is horizontally and radially ejected from the upper gas ejection port 243. Similarly, the gas supplied into the annular space between the intermediate plate 235 and the lower plate 263 is horizontally and radially ejected from the lower gas ejection port 266. Thus, the gas supplied into the gas ejection nozzle 211 from the first gas supply pipe 223 is ejected from the upper gas ejection port 243 and the lower gas ejection port 266 through the gas flow passage 267.

As described above, the sectional area of the flow passage defined between the connection portion 259 and the outer structural member 231 is smaller than the sectional area of the flow passage defined between the hollow cylindrical portion 257 and the outer structural member 231, so that the gas impinging on the outer peripheral surface of the hollow cylindrical portion 257 mainly circumferentially spreads in the space between the hollow cylindrical portion 257 and the outer structural member 231. Therefore, the gas is evenly supplied into the entire circumferential space between the connection portion 259 and the outer structural member 231. Further, the gas ejected from the joint connection hole 240 toward the inside space of the peripheral wall portion 237 impinges on the outer peripheral surface of the hollow cylindrical portion 257. Since the sectional area of the flow passage between the connection portion 259 and the outer structural member 231 is sufficiently small, the gas passes through the space between the connection portion 259 and the outer structural member 231 at a speed sufficiently lower than immediately after the gas is ejected from the joint connection hole 240. Therefore, the gas is supplied into the entire circumferential space between the upper plate 234 and the intermediate plate 235 and into the entire circumferential space between the intermediate plate 235 and the lower plate 263 at an even flow rate and at an even pressure. Thus, the gas is ejected circumferentially from the upper gas ejection port 243 and the lower gas ejection port 266 at an even flow rate and at an even pressure.

On the other hand, the gas supplied into the gas ejection nozzle 211 from the second gas supply pipe 225 is ejected downward from the center gas ejection port 265. More specifically, the gas supplied into the gas ejection nozzle 211 from the second gas supply pipe 225 flows into the inside space of the hollow cylindrical portion 257 through the center through-hole 254. Then, the gas flowing into the inside space of the hollow cylindrical portion 257 spreads in an upper portion of the inside space of the hollow cylindrical portion 257 above the partition portion 258. Further, the gas spreading into the upper portion flows downward through the gas flow holes 260. Thus, the gas supplied into the gas ejection nozzle 211 from the second gas supply pipe 225 is ejected downward from the center gas ejection port 265.

As described above, the sectional area of the flow passage inside the hollow cylindrical portion 257 is greater than the sectional area of the flow passage in the center through-hole 254, so that the flow rate of the gas supplied into the inside space of the hollow cylindrical portion 257 from the center through-hole 254 is sufficiently reduced. Further, the gas supplied into the upper portion of the inside space of the hollow cylindrical portion 257 above the partition portion 258 spreads in the upper portion, and then passes through the gas flow holes 260. Therefore, the gas is ejected at an even flow rate from the gas flow holes 260. Thus, the gas supplied into the gas ejection nozzle 211 from the second gas supply pipe 225 is ejected downward from the entire center gas ejection port 265 at a pressure reduced with its flow rate sufficiently reduced.

FIG. 16 is a schematic side view of the gas ejection nozzle 211 and the substrate W for explaining a gas ejection state observed when the gas is ejected from the three gas ejection ports 243, 265, 266 with the gas ejection nozzle 211 being located adjacent the center portion of the upper surface of the substrate W.

When the gas is ejected from the center gas ejection port 265 with the gas ejection nozzle 211 being located adjacent the center portion of the upper surface of the substrate W, the ejected gas flows outward through the space between the lower surface 211a of the gas ejection nozzle 211 and the upper surface of the substrate W. Therefore, the gas ejected from the center gas ejection port 265 is horizontally and radially ejected from an annular space defined between the outer peripheral surface of the gas ejection nozzle 211 and the upper surface of the substrate W. The gas ejected from the annular space is attracted to the substrate W due to the Coanda effect to flow over the upper surface of the substrate W. Therefore, when the gas is ejected from the center gas ejection port 265 with the gas ejection nozzle 211 being located adjacent the center portion of the upper surface of the substrate W, a gas-flow is formed as spreading radially about the center portion of the upper surface of the substrate W, so that the entire upper surface of the substrate W is covered with the gas-flow.

On the other hand, when the gas is horizontally and radially ejected from the upper gas ejection port 243 and the lower gas ejection port 266 with the gas ejection nozzle 211 being located adjacent the center portion of the upper surface of the wafer W, the gas ejected from the lower gas ejection port 266 is attracted to the substrate W due to the Coanda effect to flow over the upper surface of the substrate W. Similarly, the gas ejected from the upper gas ejection port 243 is attracted to the substrate W due to the Coanda effect to flow over the gas-flow formed by the gas ejected from the lower gas ejection port 266. Therefore, when the gas is ejected from the upper gas ejection port 243 and the lower gas ejection port 266 with the gas ejection nozzle 211 being located adjacent the center portion of the upper surface of the substrate W, two gas-flows are formed as vertically overlapping each other and spreading radially about the center portion of the upper surface of the substrate W. Thus, the entire upper surface of the substrate W is covered with the two gas-flows.

If the gas is ejected from the center gas ejection port 265 when the gas is ejected from the upper gas ejection port 243 and the lower gas ejection port 266, the gas ejected from the lower gas ejection port 266 flows outward over an upper portion of the gas-flow formed by the gas ejected from the center gas ejection port 265. Therefore, when the gas is ejected from the three gas ejection ports 243, 265, 266 with the gas ejection nozzle 211 being located adjacent the center portion of the upper surface of the substrate W, the entire upper surface of the substrate W is covered with the three gas-flows vertically overlapping each other.

In this embodiment, the gas is ejected from the gas ejection ports 243, 265, 266, whereby the entire upper surface of the substrate W is thus covered with the gas-flows formed by the gas ejected from the gas ejection ports 243, 265, 266. Therefore, even if the foreign matter such as particles and the droplets and the mist of the treatment liquid borne on downflow toward the upper surface of the substrate W are brought into the vicinity of the upper surface of the substrate W, the foreign matter and the mist of the treatment liquid are forced to flow outward by the gas-flows. This substantially prevents the foreign matter and the like from adhering to the upper surface of the substrate W, thereby suppressing or preventing the contamination of the substrate W. By ejecting the gas from the three gas ejection ports 243, 265, 266, the entire upper surface of the substrate W can be covered with the three gas-flows vertically overlapping each other, thereby further suppressing or preventing the contamination of the substrate W.

More specifically, where the gas is ejected from the three gas ejection ports 243, 265, 266, for example, swirls are liable to occur in the lower two gas-flows in such a manner that the foreign matter brought into the vicinity of the upper surface of the substrate W is caught into the gas-flows to possibly contact the upper surface of the substrate W (as indicated by arrows A1 in FIG. 16). Even in this case, the entire upper surface of the substrate W is covered with the three gas-flows vertically overlapping each other, whereby the uppermost gas-flow forces the foreign matter to flow outward. Thus, the foreign matter is substantially prevented from being caught into the lower two gas-flows. Therefore, even if the lower two gas-flows swirl due to the ejection of the gas from the three gas ejection ports 243, 265, 266, the adhesion of the foreign matter and the mist of the treatment liquid to the upper surface of the substrate W is reliably suppressed or prevented. This suppresses or prevents the contamination of the substrate W.

Figure 17:
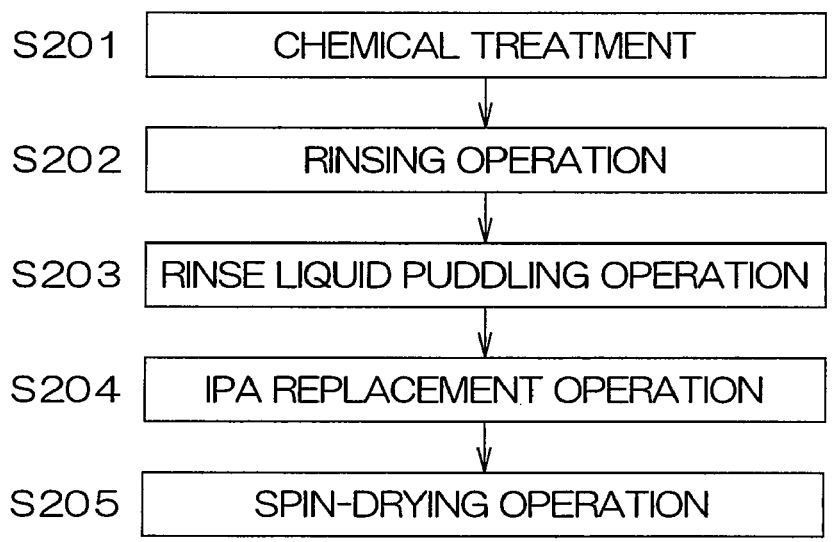
FIG. 17 is a process diagram for explaining an exemplary substrate treatment process to be performed by the substrate treatment apparatus according to the second embodiment of the present invention.

FIG. 17 is a process diagram for explaining an exemplary substrate treatment process to be performed by the substrate treatment apparatus 201. With reference to FIGS. 13, 16 and 17, the exemplary substrate treatment process will be described.

An untreated substrate W is transported into the treatment chamber 207 by a transport robot not shown, and transferred to the spin chuck 208 with its front surface (device formation surface) facing up. When the substrate W is transported into the treatment chamber 207, components such as the gas ejection nozzle 211 are retracted from above the spin chuck 208 in the treatment chamber 207 so as not to bump against the transport robot and the substrate W.

Then, a chemical treatment is performed to treat the front surface of the substrate W with hydrofluoric acid (an example of the chemical agent) (Step S201). More specifically, the control section 216 controls the motor 215 to rotate the substrate W held by the spin chuck 208 at a predetermined rotation speed. Then, the control section 216 opens the chemical agent valve 217 to spout the hydrofluoric acid from the chemical agent nozzle 209 toward a center portion of the upper surface of the substrate W. The spouted hydrofluoric acid is applied onto the center portion of the upper surface of the substrate W, and receives a centrifugal force generated by the rotation of the substrate W to spread outward over the substrate W. Thus, the hydrofluoric acid is supplied onto the entire upper surface of the substrate W, whereby the chemical treatment is performed on the front surface of the substrate W. After the chemical treatment is performed for a predetermined period, the control section 216 closes the chemical agent valve 217 to stop ejecting the hydrofluoric acid from the chemical agent nozzle 209.

In turn, a rinsing operation is performed to rinse the front surface of the substrate W with deionized water (an example of the rinse liquid) (Step S202). More specifically, the control section 216 opens the rinse liquid valve 219 to spout the deionized water from the rinse liquid nozzle 210 toward the center portion of the upper surface of the substrate W being rotated. Thus, the deionized water is supplied to the entire upper surface of the substrate W, whereby the hydrofluoric acid is rinsed away from the substrate W by the deionized water. Thus, the rinsing operation is performed on the front surface of the substrate W.

Subsequently, a puddling operation is performed to treat the substrate W with a deionized water film retained on the substrate W (Step S203). More specifically, the control section 216 controls the motor 215 to stop the rotation of the substrate W or to reduce the rotation speed of the substrate W (e.g., to about 10 to about 30 rpm) while continuously spouting the deionized water from the rinse liquid nozzle 210. This reduces a centrifugal force acting on the deionized water on the substrate W, thereby reducing the amount of the deionized water spun off around the substrate W. Therefore, the deionized water supplied from the rinse liquid nozzle 210 is retained on the upper surface of the substrate W for deionized water puddling. Thus, the deionized water film is formed as covering the entire upper surface of the substrate W. After the formation of the deionized water film on the substrate W, the control section 216 closes the rinse liquid valve 219 to stop spouting the deionized water from the rinse liquid nozzle 210. Then, the deionized water film is retained on the substrate W for a predetermined period. Thus, the puddling operation using the deionized water is performed to treat the upper surface of the substrate W with the deionized water film retained on the substrate W.

In turn, an IPA replacement operation is performed to replace the deionized water film with the IPA (an example of the organic solvent more volatile than the deionized water) on the substrate W (Step S204). More specifically, the control section 216 controls the nozzle pivot mechanism 226 to locate the gas ejection nozzle 211 above the center portion of the substrate W held by the spin chuck 208. At this time, the gas ejection nozzle 211 is located at the upper position (shown in FIG. 13). Thereafter, the control section 216 opens the treatment liquid valve 229 to spout the IPA from the treatment liquid nozzle 228 toward the center portion of the upper surface of the substrate W. While the IPA is spouted from the treatment liquid nozzle 228, the control section 216 controls the motor 215 to accelerate the rotation speed of the substrate W to a predetermined level. With the rotation speed of the substrate W kept at the predetermined level, the IPA is supplied onto the substrate W.

The IPA spouted from the treatment liquid nozzle 228 is applied onto the center portion of the upper surface of the substrate W, and then receives a centrifugal force generated by the rotation of the substrate W to move outward over the substrate W. Therefore, the deionized water film retained on the substrate W is replaced with the IPA gradually outward from the center portion of the upper surface of the substrate W. The IPA is an organic solvent in which the deionized water is highly soluble. While the deionized water on the substrate W is dissolved in the IPA, the deionized water is replaced with the IPA on the substrate W. Thus, the IPA replacement operation is performed for a predetermined period to replace the deionized water film with an IPA film on the substrate W, and the entire upper surface of the substrate W is finally covered with the IPA film. After the IPA replacement operation is performed for a predetermined period, the control section 216 closes the treatment liquid valve 229 to stop spouting the IPA from the treatment liquid nozzle 228.

Subsequently, a drying operation (spin-drying operation) is performed to dry he substrate W (Step S205). More specifically, the control section 216 controls the motor 215 to accelerate the rotation of the substrate W. Thus, the IPA is spun out of the substrate W, whereby the thickness of the IPA film is reduced. After the acceleration of the rotation of the substrate W, the control section 216 controls the nozzle lift mechanism 227 to move the gas ejection nozzle 211 from the upper position to the adjacent position (shown in FIG. 16). At this time, the thickness of the IPA film is reduced, so that the lower surface 211*a* of the gas ejection nozzle 211 is opposed to the center portion of the upper surface of the substrate W with the lower end of the gas ejection nozzle 211 being prevented from being immersed in the IPA film.

After the acceleration of the rotation of the substrate W, the control section 216 opens the first gas valve 222 and the second gas valve 224 to eject nitrogen gas (an example of the gas) from the three gas ejection ports 243, 265, 266. The control section 216 may start the ejection of the nitrogen gas from the respective gas ejection ports 243, 265, 266 before or after the gas ejection nozzle 211 is moved from the upper position to the adjacent position. Further, the control section 216 may eject the nitrogen gas simultaneously from the three gas ejection ports 243, 265, 266, or may eject the nitrogen gas from the upper and lower gas ejection ports 243, 266 and from the center gas ejection port 265 at different times.

The nitrogen gas spouted from the center gas ejection port 265 is applied onto the center portion of the upper surface of the substrate W. At this time, the pressure of the nitrogen gas applied onto the center portion of the upper surface of the substrate W is sufficiently reduced, so that partial drying of the upper surface of the substrate W is suppressed or prevented which may otherwise occur when the IPA liquid film is removed from the center portion of the upper surface of the substrate W. The nitrogen gas spouted from the center gas ejection port 265 flows outward between the lower surface 211*a* of the gas ejection nozzle 211 and the IPA film on the substrate W. Therefore, the nitrogen gas ejected from the center gas ejection port 265 is further ejected horizontally and radially through an annular space defined between the outer peripheral surface of the gas ejection nozzle 211 and the IPA film. Further, the nitrogen gas ejected through the annular space is attracted to the substrate W due to the Coanda effect to flow over the upper surface of the IPA film. Thus, a gas-flow is formed as spreading radially about the center portion of the upper surface of the substrate W to cover the entire upper surface of the substrate W.

Further, the nitrogen gas ejected from the lower gas ejection port 266 is attracted to the substrate W due to the Coanda effect to flow outward over a gas-flow formed by the nitrogen gas ejected from the center gas ejection port 265. The nitrogen gas ejected from the upper gas ejection port 243 is also attracted to the substrate W due to the Coanda effect to flow over a gas-flow formed by the nitrogen gas ejected from the lower gas ejection port 266. Therefore, upon the start of the ejection of the nitrogen gas from the three gas ejection ports 243, 265, 266, the three gas-flows are formed on the substrate W as vertically overlapping each other and spreading radially about the center portion of the upper surface of the substrate W. The entire upper surface of the substrate W is covered with the three gas-flows.

After the start of the ejection of the nitrogen gas from the three gas ejection ports 243, 265, 266, the control section 216 controls the motor 215 to rotate the substrate W at a higher rotation speed (e.g., several thousands rpm). Thus, the IPA is spun out of the substrate W to dry the substrate W. Since the substrate W is dried with its upper surface covered with the three gas-flows, the foreign matter such as particles and the mist of the treatment liquid borne on the down-flow toward the upper surface of the substrate W are substantially prevented from adhering to the substrate W during the drying operation. This makes it possible to dry the substrate W while suppressing or preventing the contamination of the substrate W. After the IPA is removed from the substrate W, the nitrogen gas ejected from the three gas ejection ports 243, 265, 266 flows over the upper surface of the substrate W. Therefore, the substrate W is dried with the upper surface thereof maintained in a lower oxygen concentration atmosphere. This makes it possible to dry the substrate W while suppressing or preventing water marks and other drying failures.

After the substrate W is rotated at a higher rotation speed for a predetermined period, the control section 216 causes the spin chuck 208 to stop rotating the substrate W. After the spin chuck 208 stops the rotation of the substrate W, the control section 216 closes the first gas valve 222 and the second gas valve 224 to stop ejecting the nitrogen gas from the three gas ejection ports 243, 265, 266. After the ejection of the nitrogen gas from the three gas ejection ports 243, 265, 266, the control section 216 controls the nozzle pivot mechanism 226 to retract the gas ejection nozzle 211 to the lateral side of the spin chuck 208. Thereafter, the treated substrate W is unloaded from the treatment chamber 207 by the transport robot.

Figure 18:
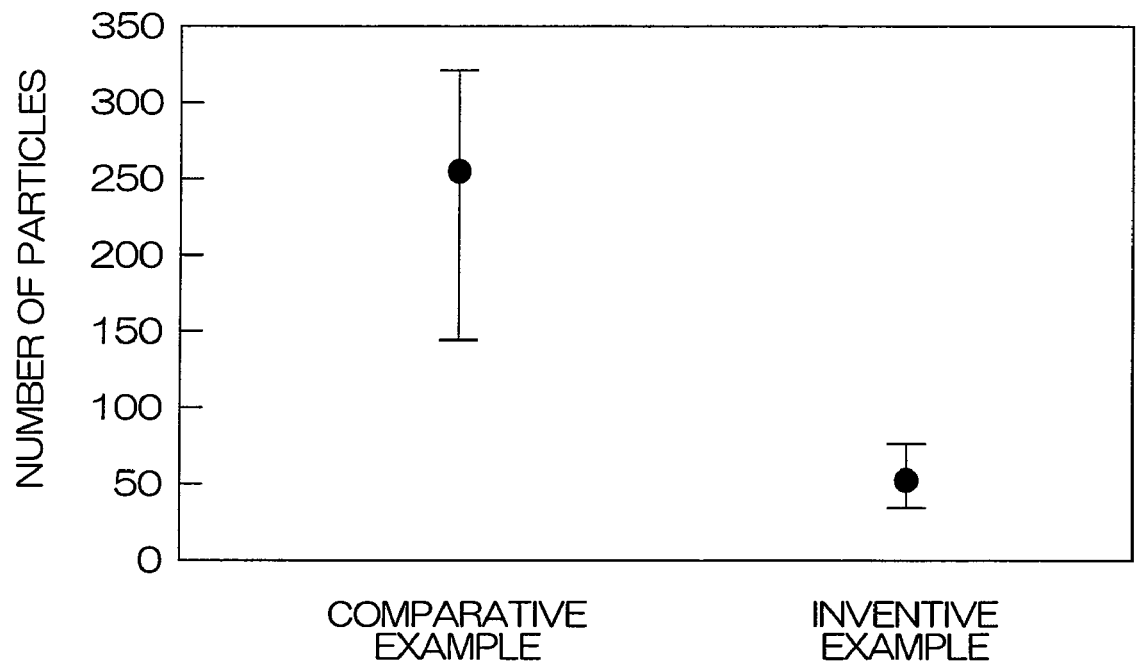
FIG. 18 is a graph showing the numbers of particles adhering to substrates.
Figure 19:
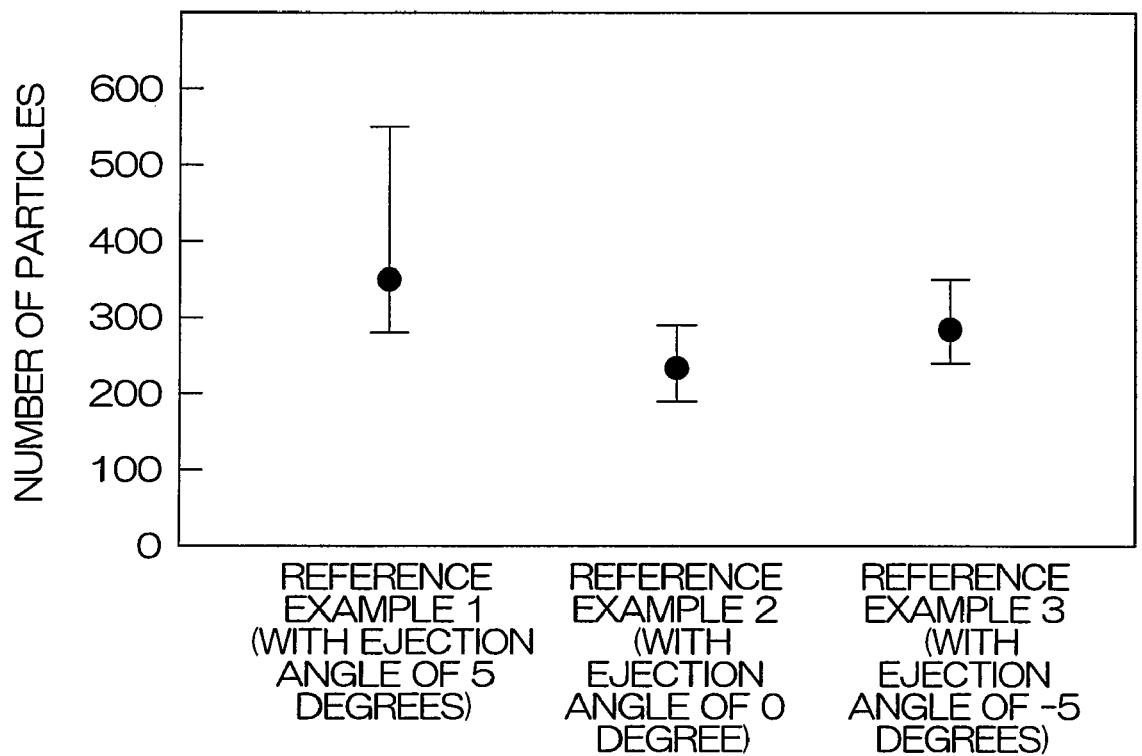
FIG. 19 is a graph showing the numbers of particles adhering to substrates.

FIGS. 18 and 19 are graphs showing the numbers of particles adhering to substrates W. The treatment process (described with reference to FIG. 17 and the like) was performed on a substrate W in the following manner, and the number of particles adhering to the substrate W was measured by a particle counter. The measurement results will be described later. First, the dimensions of the gas ejection nozzle 211 used herein will be described specifically with reference to FIG. 14. A vertical distance G201 between the lower surface of the upper plate 234 and the upper surface of the intermediate plate 235 was 1.5 mm. A vertical distance G202 between the lower surface of the intermediate plate 235 and the upper surface of the lower plate 263 was 4 mm. Further, the thickness T201 of the intermediate plate 235 (as measured vertically) was 10 mm. The outer diameter D201 of the lower plate 263 was 100 mm. The inner diameter D202 of the plate member 246 was 34 mm.

The substrate W to be treated was a round substrate having a diameter of 300 mm. During the drying operation, the gas ejection nozzle 211 was located in the vicinity of the center portion of the upper surface of the substrate W, so that the upper surface of the substrate W and the lower surface 211a of the gas ejection nozzle 211 were vertically spaced 4 mm from each other. During the drying operation, the nitrogen gas was supplied into the gas ejection nozzle 211 from the first gas supply pipe 223 at 80 L/min, and supplied into the gas ejection nozzle 211 from the second gas supply pipe 225 at 50 L/min. When the nitrogen gas was ejected from the three gas ejection ports 243, 265, 266 under these conditions, nitrogen gas flow rates measured at eight positions around the upper gas ejection port 243 were within the range of 0.2 m/s to 0.3 m/s. Further, nitrogen gas flow rates measured at eight positions around the lower gas ejection port 266 were within the range of 1.8 m/s to 2.2 m/s. Nitrogen gas flow rates measured at eight positions around the annular space between the outer peripheral surface of the lower plate 263 and the upper surface of the substrate W were within the range of 1.8 m/s to 2.6 m/s. Therefore, the flow rate V201 (see FIG. 16) of the nitrogen gas ejected from the upper gas ejection port 243 was lower than the flow rate V202 (see FIG. 16) of the nitrogen gas ejected from the lower gas ejection port 266. Further, the flow rate V202 of the nitrogen gas ejected from the lower gas ejection port 266 was substantially equal to the flow rate V203 (see FIG. 16) of the nitrogen gas ejected from the annular space between the outer peripheral surface of the lower plate 263 and the upper surface of the substrate W.

Comparison of Particle Numbers Resulting from Treatment Processes Performed with and without Upper Gas Ejection Port 243

Referring first to FIG. 18, the number of particles adhering to a substrate W treated with the use of the gas ejection nozzle 211 (Inventive Example) and the number of particles adhering to a substrate W treated with the use of a gas ejection nozzle having substantially the same construction as the gas ejection nozzle 211 but not provided with the upper gas ejection port 243 (Comparative Example) were compared with each other.

Measurement values shown in FIG. 18 were obtained by measuring the numbers of particles each having a size of greater than 0.06 μm on a plurality of treated substrates W. In FIG. 18, a maximum value, a minimum value and an average of the particle numbers for each of Inventive Example and Comparative Example are indicated by an upper end of an I-shaped bar, a lower end of the I-shaped bar and a black dot, respectively. Inventive Example and Comparative Example employ substantially the same conditions, except that the upper gas ejection port 243 was not provided in the nozzle used for the treatment process in Comparative Example.

As shown in FIG. 18, the numbers of the particles present on the substrates W treated with the use of the gas ejection nozzle not provided with the upper gas ejection port 243 (Comparative Example) were in the range of 140 to 320. In contrast, as shown in FIG. 18, the numbers of the particles present on the substrates W treated with the use of the gas ejection nozzle 211 (Inventive Example) were in the range of 40 to 80. Though not shown, the number of particles (each having a size of greater than 0.06 μm) on a substrate W subjected to the drying operation without covering the substrate W with the nitrogen gas-flows was not less than 200,000. Therefore, the cleanliness of the substrate W was significantly improved by performing the drying operation with the upper surface of the substrate W covered with the nitrogen gas-flows. The cleanliness of the substrate W is further improved by performing the drying operation under the aforementioned conditions with the use of the gas ejection nozzle 211 including the upper gas ejection port 243 and the lower gas ejection port 266.

Comparison of Particle Numbers Resulting from Treatment Processes Performed with Different Ejection Angles Referring next to FIG. 19, a particle number resulting from a treatment process performed with the nitrogen gas ejected horizontally from the lower gas ejection port 266 was compared with a particle number resulting from a treatment process performed with the nitrogen gas ejected obliquely upward or downward from the lower gas ejection port 266.

Measurement values shown in FIG. 19 were the numbers of particles present on substrates W respectively treated with the use of three types of gas ejection nozzles each having substantially the same construction as the gas ejection nozzle 211 but not provided with the upper gas ejection nozzle 243. The measurement values shown in FIG. 19 were obtained by measuring the numbers of particles each having a size of greater than 0.06 μm on the treated substrates W. In FIG. 19, a maximum value, a minimum value and an average of the particle numbers for each of Reference Examples are indicated by an upper end of an I-shaped bar, a lower end of the I-shaped bar and a black dot, respectively.

The measurement values of Reference Example 1 (with an ejection angle of 5 degrees) were the numbers of particles present on substrates W each treated with the use of a gas ejection nozzle configured to eject the nitrogen gas obliquely downward from the lower gas ejection port 266 at an inclination angle of 5 degrees with respect to a horizontal plane. The measurement values of Reference Example 2 (with an ejection angle of 0 degree) were the numbers of particles present on substrates W each treated with the use of a gas ejection nozzle configured to eject the nitrogen gas horizontally from the lower gas ejection port 266. The measurement values of Reference Example 3 (with an ejection angle of −5 degrees) were the numbers of particles present on substrates W each treated with the use of a gas ejection nozzle configured to eject the nitrogen gas obliquely upward from the lower gas ejection port 266 at an inclination angle of 5 degrees with respect to a horizontal plane. Reference Examples 1 to 3 employ substantially the same conditions, except that the three nozzles used for the treatment of the substrates W had different nitrogen gas ejection angles.

In Reference Example 1 shown in FIG. 19, the numbers of the particles present on the substrates W treated with the use of the gas ejection nozzle configured to eject the nitrogen gas from the lower gas ejection port 266 at an ejection angle of 5 degrees were in the range of 280 to 550. In Reference Example 2 shown in FIG. 19, the numbers of the particles present on the substrates W treated with the use of the gas ejection nozzle configured to eject the nitrogen gas from the lower gas ejection port 266 horizontally (at an ejection angle of 0 degree) were in the range of 190 to 290. In Reference Example 3 shown in FIG. 19, the numbers of the particles present on the substrates W treated with the use of the gas ejection nozzle configured to eject the nitrogen gas from the lower gas ejection port 266 at an ejection angle of −5 degrees were in the range of 240 to 350.

These measurement values indicate that the contamination of the substrate W can be suppressed by setting the angle of the ejection of the nitrogen gas from the lower gas ejection port 266 at not greater than 0 degree (a negative angle herein means an upward ejection direction with respect to the horizontal plane). Further, the contamination of the substrate W can be further suppressed by setting the angle of the ejection of the nitrogen gas from the lower gas ejection port 266 at 0 degree. Thus, the cleanliness of the substrate W can be improved by treating the substrate W with the use of the gas ejection nozzle 211 according to this embodiment in which the angles of the gas ejection from the upper gas ejection port 243 and the lower gas ejection port 266 were each set at 0 degree.

In this embodiment, as described above, the three layered gas-flows are formed by ejecting the gas from the upper gas ejection port 243, the lower gas ejection port 266 and the center gas ejection port 265, and the entire upper surface of the substrate W held by the spin chuck 208 is covered with the three gas-flows. Thus, the upper surface of the substrate W is reliably protected from the foreign matter such as particles and the mist of the treatment liquid, so that the contamination of the substrate W can be suppressed or prevented. This improves the cleanliness of the substrate W.

Since the gas ejection nozzle 211 is a relatively small member having a smaller diameter than the substrate W held by the spin chuck 208, the size increase of the treatment unit 206 is suppressed. In this embodiment, the plurality of treatment units 206 are provided in the substrate treatment apparatus 201, so that an increase in the footprint or the height of the substrate treatment apparatus 201 (an area occupied by the substrate treatment apparatus 201) can be significantly suppressed by suppressing the size increase of the respective treatment units 206.

While the second embodiment has thus been described, it should be understood that the present invention be not limited to the second embodiment, but various modifications may be made within the scope of the appended claims. In the second embodiment, the treatment liquid nozzle 228 has a single flow passage, and a single type of treatment liquid (IPA) is spouted from the treatment liquid nozzle 228 by way of example, but not by way of limitation. For example, as shown in FIG. 20, a nozzle 128 having a plurality of flow passages therein may be employed as the treatment liquid nozzle.

Figure 20:
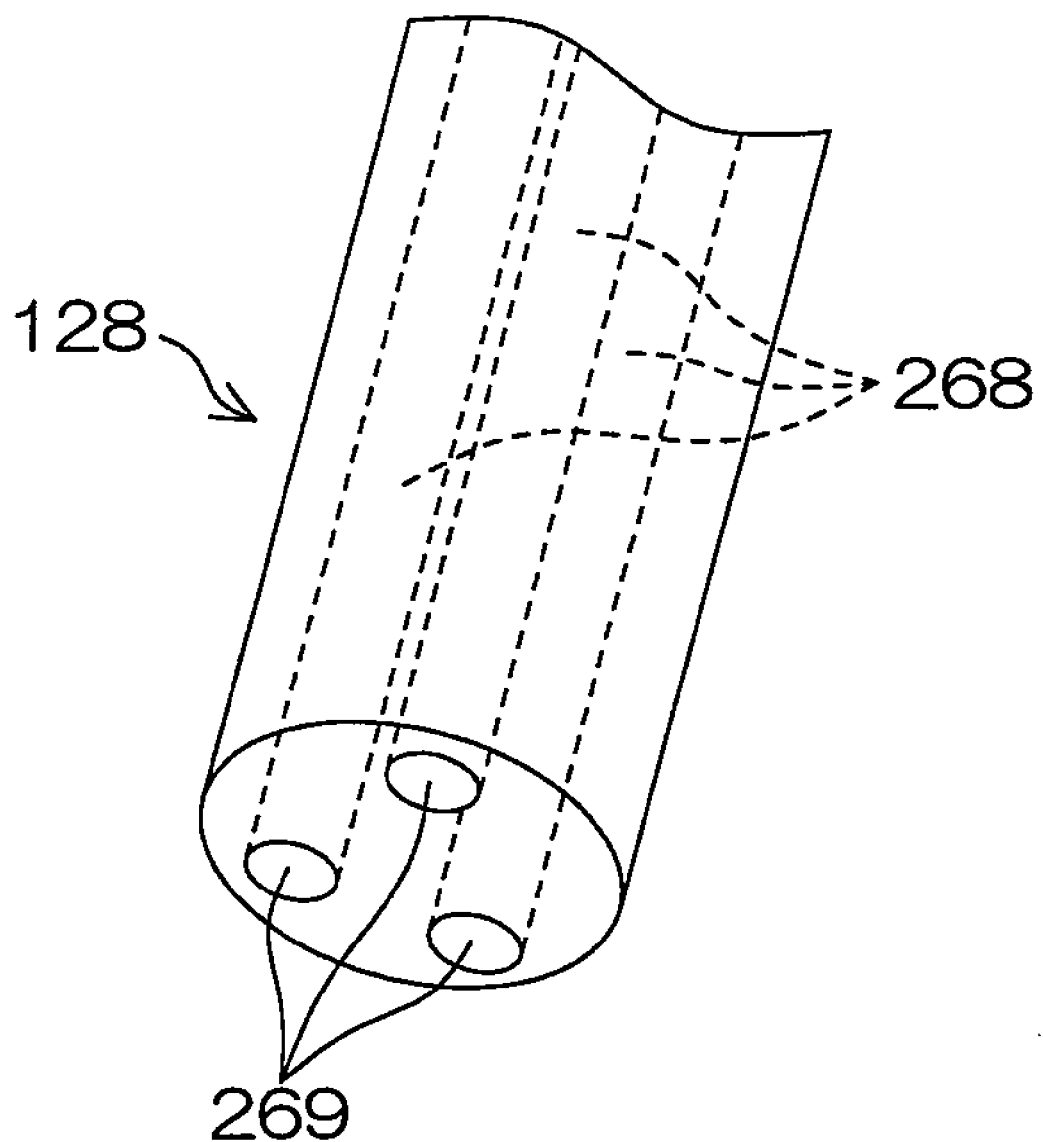
FIG. 20 is a schematic external view of a treatment liquid nozzle according to another embodiment of the present invention.

The treatment liquid nozzle 128 shown in FIG. 20 has three separate flow passages 268 each extending longitudinally therein, and is capable of spouting treatment liquids respectively supplied into the three flow passages 268 from three treatment liquid ejection ports 269 provided in one end of the treatment liquid nozzle 128. Therefore, where different types of treatment liquids are respectively supplied into the three flow passages 268, the different types of treatment liquids can be spouted from the treatment liquid nozzle 128. Further, where a gas is supplied into any one of the flow passages 268, not only the treatment liquids but also the gas can be ejected from the treatment liquid nozzle 128. Therefore, the gas ejection nozzle 211 according to the second embodiment may be modified so as to eject the nitrogen gas from any one of the flow passages 268 and eject the IPA from another of the flow passages 268 by inserting the treatment liquid nozzle 128 into the cylindrical column member 244 rather than providing the center through-hole 254 and the treatment liquid nozzle 228. Further, the gas ejection nozzle 211 may be configured so as to spout the deionized water (an example of the rinse liquid) from the other flow passage 268 to perform the rinsing operation. In this case, the rinse liquid nozzle 210 may be obviated.

In the second embodiment, the gas is horizontally ejected from the upper gas ejection port 243 and the lower gas ejection port 266 of the gas ejection nozzle 211 by way of example, but not by way of limitation. The gas may be ejected obliquely upward or downward from the upper gas ejection port 243 and the lower gas ejection port 266. Where the gas is ejected obliquely downward from the upper gas ejection port 243 and the lower gas ejection port 266, more specifically, the gas ejection nozzle 211 may be configured, for example, so that the gas is ejected toward the peripheral portion of the upper surface of the substrate W held by the spin chuck 208 or toward a perimeter defined by the holder members 214.

In the exemplary substrate treatment process according to the second embodiment, the chemical treatment, the rinsing operation, the puddling operation with the use of the deionized water, the IPA replacement operation and the drying operation are sequentially performed by way of example, but the substrate treatment process performed with the use of the gas ejection nozzle 211 is not limited to the aforementioned treatment process. For example, the exemplary substrate treatment process described above may be modified so that the drying operation immediately follows the puddling operation using the deionized water without performing the IPA replacement operation.

In the second embodiment, the substrate W is a round substrate by way of example, but is not limited to the round substrate. For example, the substrate W may be a polygonal substrate such as a rectangular substrate.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-278568 filed in the Japanese Patent Office on Oct. 29, 2008, and Japanese Patent Application No. 2009-82614 filed in the Japanese Patent Office on Mar. 30, 2009, the disclosure of which is incorporated herein by reference in its entirety.

What is claimed is:

1. A substrate treatment apparatus comprising:
a substrate holding unit which holds a substrate;
a gas ejection nozzle to be positioned adjacent a center portion of the substrate held by the substrate holding unit, the gas ejection nozzle being configured to eject a gas radially from its gas ejection port over the substrate to form a gas-flow for covering the substrate, the gas ejection nozzle being columnar, the gas ejection nozzle having a smaller diameter than the substrate held by the substrate holding unit, the gas ejection port opening in a side surface of the gas ejection nozzle;
a treatment liquid nozzle, the treatment liquid nozzle being partly disposed in the gas ejection nozzle; and
a gas supply unit which supplies the gas to the gas ejection nozzle, wherein
the gas ejection nozzle includes:
a surface opposed to one major surface of the substrate held by the substrate holding unit, said opposed surface being disposed closer to the substrate holding unit than the gas ejection port;
a fluid ejection port provided in said opposed surface; and
a flow passage connected to the fluid ejection port, the flow passage having an inlet to which a gas is supplied, the inlet having an area being smaller than an area of the fluid ejection port;
wherein the gas ejection nozzle further includes a partition portion which partitions the flow passage, the partition portion having a plurality of through-holes penetrating through the partition portion.

2. A substrate treatment apparatus as set forth in claim 1, wherein the gas ejection nozzle is configured to eject the gas from the gas ejection port toward a peripheral portion of the substrate held by the substrate holding unit.

3. A substrate treatment apparatus as set forth in claim 1, further comprising:
a rotation unit which rotates the substrate held by the substrate holding unit;
wherein the substrate holding unit includes a plurality of holding members to be disposed in association with a peripheral surface of the substrate for holding the substrate;
wherein the gas ejection nozzle is configured to eject the gas from the gas ejection port toward a perimeter defined by the holding members so as to form a gas-flow for covering the holding members and the substrate held by the holding members.

4. A substrate treatment apparatus as set forth in claim 1, wherein the gas ejection port has a slit shape, and annularly opens in an outer surface of the gas ejection nozzle.

5. A substrate treatment apparatus as set forth in claim 1, wherein the gas ejection nozzle further includes a partition portion which partitions the flow passage, the partition portion having a plurality of through-holes penetrating through the partition portion.

6. A substrate treatment apparatus as set forth in claim 1, further comprising a nozzle which spouts fluid in the flow passage.

7. A substrate treatment apparatus as set forth in claim 1, wherein the side surface of the gas ejection nozzle is an outer peripheral surface surrounding an axis passing through a center portion of the substrate held by the substrate holding unit.

8. A substrate treatment apparatus comprising:
a substrate holding unit which horizontally holds the substrate;
a gas ejection nozzle to be positioned adjacent a center portion of the substrate held by the substrate holding unit, the gas ejection nozzle including an annular first gas ejection port and an annular second gas ejection port disposed closer to the substrate holding unit than the first gas ejection port, the gas ejection nozzle being configured to eject a gas radially from the first and second gas ejection ports over one of opposite major surfaces of the substrate, the first and second gas ejection ports being provided in an outer peripheral surface of the gas ejection nozzle, wherein the gas ejection nozzle ejects the gas horizontally from the first and second gas ejection ports, the gas ejection nozzle having a smaller diameter than the substrate held by the substrate holding unit; and
a gas supply unit which supplies the gas to the gas ejection nozzle;
a treatment liquid nozzle, the treatment liquid nozzle being partly disposed in the gas ejection nozzle; and
wherein the gas ejection nozzle further includes a partition portion which partitions the flow passage, the partition portion having a plurality of through-holes penetrating through the partition portion.

9. A substrate treatment apparatus as set forth in claim 8, wherein the gas ejection nozzle further includes:
a surface opposed to the one major surface of the substrate held by the substrate holding unit, and disposed closer to the substrate holding unit than the first and second gas ejection ports; and
a third gas ejection port provided in the opposed surface.

10. A substrate treatment apparatus as set forth in claim 9, wherein the gas ejection nozzle and the gas supply unit are designed so that the gas is ejected at substantially the same flow rate from the second gas ejection port and from the third gas ejection port.

11. A substrate treatment apparatus as set forth in claim 9, wherein the gas ejection nozzle further includes a flow passage connected to the third gas ejection port, the flow passage having an inlet to which a gas is supplied, the inlet having an area smaller than an area of the third gas ejection port.

12. A substrate treatment apparatus as set forth in claim 11, wherein the gas ejection nozzle further includes a partition portion which partitions the flow passage, the partition portion having a plurality of through-holes penetrating through the partition portion.

13. A substrate treatment apparatus as set forth in claim 11, further comprising a nozzle which spouts fluid in the flow passage.

14. A substrate treatment apparatus as set forth in claim 8, wherein the gas ejection nozzle is designed so that the gas is ejected at a lower flow rate from the first gas ejection port than from the second gas ejection port.

15. A substrate treatment apparatus as set forth in claim 8, wherein the outer peripheral surface of the gas ejection nozzle is surrounding an axis passing through a center portion of the substrate held by the substrate holding unit.

16. A substrate treatment apparatus as set forth in claim 8, wherein the first gas ejection port is continuous over a whole circumference thereof, and the second gas ejection port is continuous over a whole circumference thereof.

* * * * *